US012765021B2

(12) United States Patent
Nishihara et al.

(10) Patent No.: US 12,765,021 B2
(45) Date of Patent: Oct. 13, 2026

(54) SILICON CARBIDE EPITAXIAL SUBSTRATE AND METHOD OF MANUFACTURING SILICON CARBIDE SEMICONDUCTOR DEVICE

(71) Applicant: MITSUMI ELECTRIC CO., LTD., Tokyo (JP)

(72) Inventors: Hiroki Nishihara, Osaka (JP); Tsubasa Honke, Osaka (JP); Takaya Miyase, Osaka (JP); Taro Enokizono, Osaka (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 318 days.

(21) Appl. No.: 18/563,422

(22) PCT Filed: May 16, 2022

(86) PCT No.: PCT/JP2022/020370
§ 371 (c)(1),
(2) Date: Nov. 22, 2023

(87) PCT Pub. No.: WO2022/249915
PCT Pub. Date: Dec. 1, 2022

(65) Prior Publication Data
US 2024/0363696 A1 Oct. 31, 2024

(30) Foreign Application Priority Data
May 25, 2021 (JP) ................................ 2021-087624

(51) Int. Cl.
*H10D 62/57* (2025.01)
*H10D 62/832* (2025.01)
*H10D 12/00* (2025.01)

(52) U.S. Cl.
CPC ......... *H10D 62/57* (2025.01); *H10D 62/8325* (2025.01); *H10D 12/481* (2025.01)

(58) Field of Classification Search
None
See application file for complete search history.

(56) References Cited

U.S. PATENT DOCUMENTS

| | | | | |
|---|---|---|---|---|
| 9,728,628 B2 * | 8/2017 | Wada | .................. | H10D 12/461 |
| 2014/0054609 A1 * | 2/2014 | Burk | .................. | H10P 14/2904 257/77 |

(Continued)

FOREIGN PATENT DOCUMENTS

| | | |
|---|---|---|
| JP | 2017-59670 A | 3/2017 |
| JP | 2017-76650 A | 4/2017 |
| JP | 2020-125241 A | 8/2020 |

OTHER PUBLICATIONS

L. Scaltrito et al., "Defect influence on the electrical properties of 4H-SiC Schottky diodes", Materials Science Forum vols. 457-460, pp. 1081-1084, 2004. (cited in specification).

(Continued)

*Primary Examiner* — Michelle Mandala
(74) *Attorney, Agent, or Firm* — Renner, Otto, Boisselle & Sklar, LLP

(57) ABSTRACT

A silicon carbide epitaxial substrate includes a silicon carbide substrate and a silicon carbide epitaxial layer. The silicon carbide epitaxial layer is on the silicon carbide substrate. The silicon carbide epitaxial layer has a main surface located opposite to an interface between the silicon carbide substrate and the silicon carbide epitaxial layer. An area density of a pit in the main surface is 1/cm$^2$ or less. An area density of a bump in the main surface is less than 0.7/cm$^2$. An area of the pit is 100 μm$^2$ or less, and an area of the bump is 100 μm$^2$ or less when viewed in a direction perpendicular to the main surface. A depth of the pit is 0.01

(Continued)

μm to 0.1 μm and a height of the bump is 0.01 μm to 0.1 μm in the direction perpendicular to the main surface.

7 Claims, 22 Drawing Sheets

(56) References Cited

U.S. PATENT DOCUMENTS

| | | | | |
|---|---|---|---|---|
| 2016/0197155 | A1* | 7/2016 | Hiyoshi | H10D 30/021 257/77 |
| 2018/0096854 | A1* | 4/2018 | Wada | H10P 52/402 |
| 2019/0019868 | A1* | 1/2019 | Wada | C30B 25/20 |
| 2019/0371894 | A1* | 12/2019 | Maekawa | H10D 30/668 |

OTHER PUBLICATIONS

Notice of Reasons for Refusal for corresponding Japan Application No. 2023-523420, dated Jun. 2, 2026, with Machine Translation.

* cited by examiner

SILICON CARBIDE EPITAXIAL SUBSTRATE AND METHOD OF MANUFACTURING SILICON CARBIDE SEMICONDUCTOR DEVICE

TECHNICAL FIELD

The present disclosure relates to a silicon carbide epitaxial substrate and a method of manufacturing a silicon carbide semiconductor device. The present application claims priority to Japanese Patent Application No. 2021-087624 filed on May 25, 2021, the entire contents of which are incorporated herein by reference.

BACKGROUND

A defect map of a 4H—SiC wafer is described in L. Scaltrito and 13 others, "Defect influence on the electrical properties of 4H—SiC Schottky diodes", Materials Science Forum Vols. 457-460, pages 1081-1084, 2004 (Non-PTL 1).

CITATION LIST

Non Patent Literature

Non-PTL 1: L. Scaltrito and 13 others, "Defect influence on the electrical properties of 4H—SiC Schottky diodes", Materials Science Forum Vols. 457-460, pages 1081-1084, 2004.

SUMMARY OF INVENTION

A silicon carbide epitaxial substrate according to the present disclosure includes a silicon carbide substrate and a silicon carbide epitaxial layer. The silicon carbide epitaxial layer is on the silicon carbide substrate. The silicon carbide epitaxial layer has a main surface located opposite to an interface between the silicon carbide substrate and the silicon carbide epitaxial layer. An area density of a pit in the main surface is $1/cm^2$ or less. An area density of a bump in the main surface is less than $0.7/cm^2$. An area of the pit is $100\ \mu m^2$ or less and an area of the bump is $100\ \mu m^2$ or less when viewed in a direction perpendicular to the main surface. A depth of the pit is 0.01 μm to 0.1 μm and a height of the bump is 0.01 μm to 0.1 μm in the direction perpendicular to the main surface.

A silicon carbide epitaxial substrate according to the present disclosure includes a silicon carbide epitaxial layer and a silicon carbide substrate. The silicon carbide epitaxial layer is on the silicon carbide substrate. The silicon carbide epitaxial layer has a main surface located opposite to an interface between the silicon carbide substrate and the silicon carbide epitaxial layer. An area density of a three-dimensional oblique defect in the main surface is $0.006/cm^2$ to $0.2/cm^2$.

DETAILED DESCRIPTION

Figure 1:
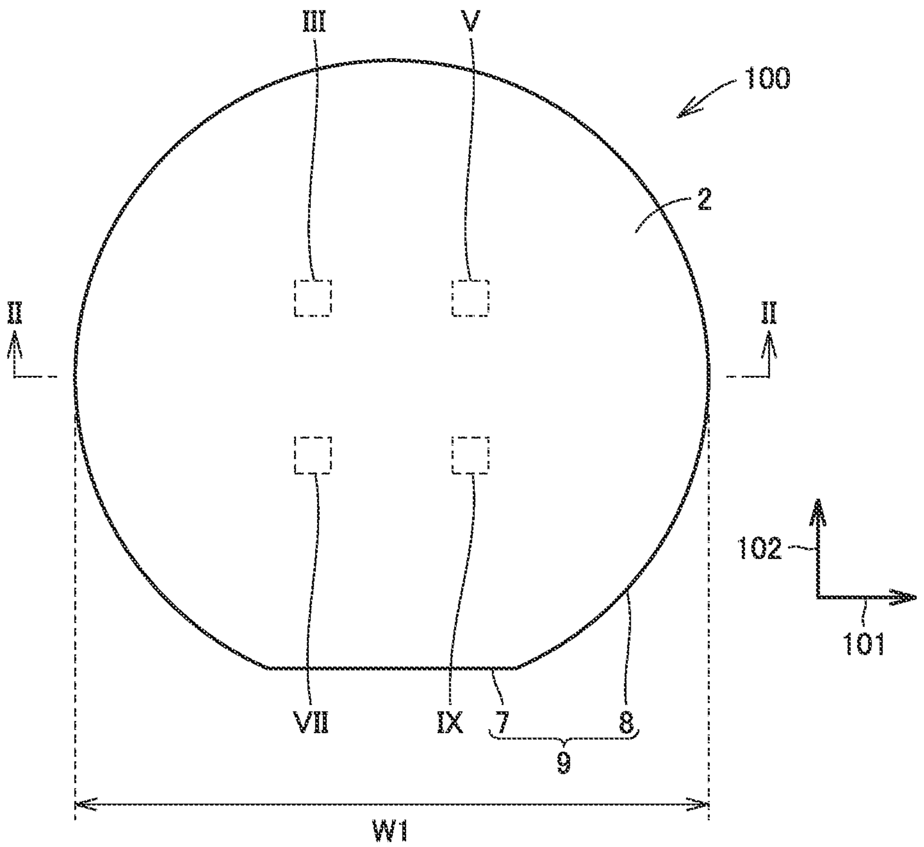
FIG. 1 is a schematic plan view showing the configuration of a silicon carbide epitaxial substrate according to the present embodiment.

Problem to be Solved by the Present Disclosure

An object of the present disclosure is to provide a silicon carbide epitaxial substrate and a method of manufacturing a silicon carbide semiconductor device that allow the reliability of the silicon carbide semiconductor device to be improved.

Advantageous Effects of the Present Disclosure

According to the present disclosure, it is possible to provide a silicon carbide epitaxial substrate, a method of manufacturing a silicon carbide epitaxial substrate, and a method of manufacturing a silicon carbide semiconductor device that allow the reliability of the silicon carbide semiconductor device to be improved.

Description of Embodiment of Present Disclosure

First, embodiments of the present disclosure will be listed and described.

(1) A silicon carbide epitaxial substrate 100 according to the present disclosure includes a silicon carbide substrate 11 and a silicon carbide epitaxial layer 22. Silicon carbide epitaxial layer 22 is on silicon carbide substrate 11. Silicon carbide epitaxial layer 22 has a main surface 2 located opposite to an interface 3 between silicon carbide substrate 11 and silicon carbide epitaxial layer 22. An area density of a pit 10 in main surface 2 is $1/cm^2$ or less. An area density of a bump 20 in main surface 2 is less than $0.7/cm^2$. An area of pit 10 is 100 $\mu m^2$ or less and an area of bump 20 is 100 $\mu m^2$ or less when viewed in a direction perpendicular to main surface 2. A depth of pit 10 is 0.01 μm to 0.1 μm and a height of bump 20 is 0.01 μm to 0.1 μm in the direction perpendicular to main surface 2.

(2) In silicon carbide epitaxial substrate 100 according to (1), silicon carbide epitaxial layer 22 may have a thickness of 15 μm or more.

(3) In silicon carbide epitaxial substrate 100 according to (1), silicon carbide epitaxial layer 22 may have a thickness of less than 15 μm. The area density of bump 20 in main surface 2 may be $0.1/cm^2$ or less. The area density of pit 10 in main surface 2 may be $0.5/cm^2$ or less.

(4) In silicon carbide epitaxial substrate 100 according to any one of (1) to (3), an area density of three-dimensional oblique defect 40 in main surface 2 may be $0.006/cm^2$ to $0.2/cm^2$.

(5) In silicon carbide epitaxial substrate 100 according to any one of (1) to (4), an area density of scratch 30 in main surface 2 may be $1/cm^2$ or less. A width of scratch 30 may be 10 μm or less and a length of scratch 30 may be 150 mm or less when viewed in the direction perpendicular to main surface 2. A depth of scratch 30 may be 0.2 μm or more in the direction perpendicular to the main surface.

(6) A silicon carbide epitaxial substrate 100 according to the present disclosure includes a silicon carbide epitaxial layer 22 and a silicon carbide substrate 11. Silicon carbide epitaxial layer 22 is on silicon carbide substrate 11. Silicon carbide epitaxial layer 22 has a main surface 2 located opposite to an interface 3 between silicon carbide substrate 11 and silicon carbide epitaxial layer 22. An area density of three-dimensional oblique defect 40 in main surface 2 is $0.006/cm^2$ to $0.2/cm^2$.

(7) A method of manufacturing a silicon carbide semiconductor device 400 according to the present disclosure includes the following steps. Silicon carbide epitaxial substrate 100 according to any one of (1) to (6) is prepared. Silicon carbide epitaxial substrate 100 is processed.

Details of Embodiments of Present Disclosure

The details of the embodiment of the present disclosure will be described below with reference to the drawings. In the drawings below, the same or corresponding elements are designated by the same reference symbols and the same description thereof will not be repeated. Regarding crystallographic denotation in the present description, an individual orientation, a group orientation, an individual plane, and a group plane are shown in [ ], < >, ( ) and { }, respectively. A crystallographically negative index is normally expressed by a number with a bar "-" thereabove, however, in the present description, a negative sign precedes a number.

(Silicon Carbide Epitaxial Substrate)

First, the configuration of silicon carbide epitaxial substrate 100 according to the present embodiment will be described. FIG. 1 is a schematic plan view showing the configuration of silicon carbide epitaxial substrate 100 according to the present embodiment.

As shown in FIG. 1, silicon carbide epitaxial substrate 100 according to the present embodiment has second main surface 2 and an outer peripheral side surface 9. Second main surface 2 extends along each of a first direction 101 and a second direction 102. First direction 101 is, for example, a <11-20> direction. Second direction 102 is, for example, a <1-100> direction.

Second main surface 2 is a plane inclined relative to a {0001} plane. An off-angle of second main surface 2 relative to the {0001} plane may be, for example, 5° or less. Specifically, second main surface 2 may be a plane inclined at an off-angle of 5° or less relative to a (0001) plane. Second main surface 2 may be a plane inclined at an off-angle of 5° or less relative to a (000-1) plane. A direction of inclination (off-direction) of second main surface 2 relative to the {0001} plane is, for example, a <11-20> direction. The off-angle of second main surface 2 relative to the {0001} plane may be, for example, 4° or less, or 3° or less.

As shown in FIG. 1, outer peripheral side surface 9 includes an orientation flat portion 7 and an arc-shaped portion 8. Arc-shaped portion 8 is contiguous to orientation flat portion 7. As shown in FIG. 1, when viewed in a direction perpendicular to second main surface 2, orientation flat portion 7 extends along first direction 101. Second main surface 2 has a diameter W1 of 100 mm or more, for example. Diameter W1 may be 150 mm or more, or may be 200 mm or more. The upper limit of diameter W1 is not particularly limited and may be, for example, 300 mm or less. When viewed in the direction perpendicular to second main surface 2, diameter W1 is the longest linear distance between two different points on outer peripheral side surface 9.

Figure 2:
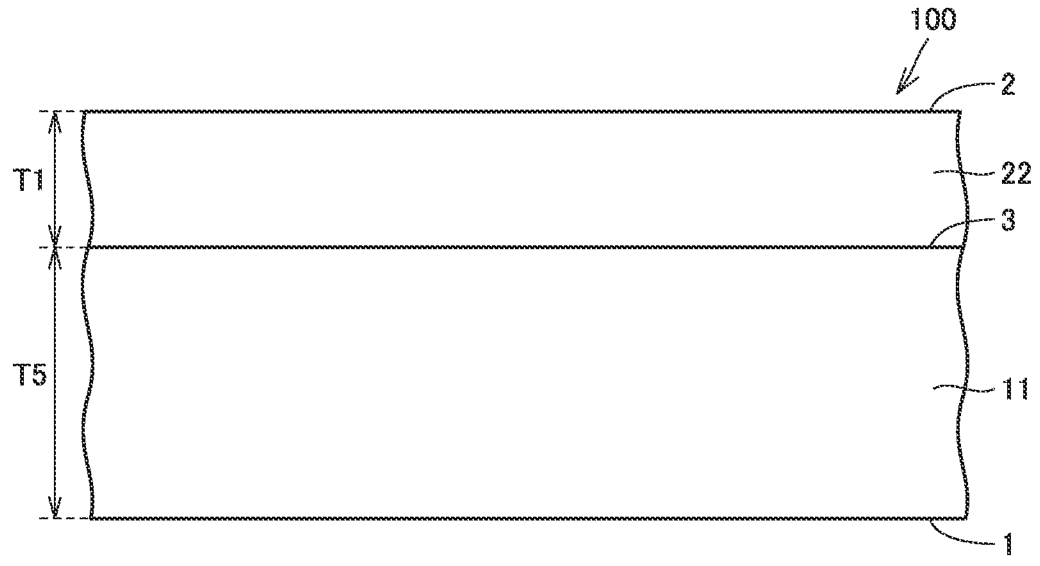
FIG. 2 is a schematic cross-sectional view taken along line II-II in FIG. 1.

FIG. 2 is a schematic cross-sectional view taken along line II-II in FIG. 1. The cross section shown in FIG. 2 is perpendicular to second main surface 2 and parallel to first direction 101. As shown in FIG. 2, silicon carbide epitaxial substrate 100 according to the present embodiment includes silicon carbide substrate 11 and silicon carbide epitaxial layer 22. Silicon carbide epitaxial layer 22 is on silicon carbide substrate 11.

Silicon carbide substrate 11 has first main surface 1 located opposite to interface 3 between silicon carbide substrate 11 and silicon carbide epitaxial layer 22. Silicon carbide epitaxial layer 22 has second main surface 2 located opposite to interface 3 between silicon carbide substrate 11 and silicon carbide epitaxial layer 22. Second main surface 2 is a front surface of silicon carbide epitaxial substrate 100. First main surface 1 is a back surface of silicon carbide epitaxial substrate 100.

Each of silicon carbide substrate 11 and silicon carbide epitaxial layer 22 is formed of, for example, silicon carbide single crystal. Specifically, each of silicon carbide substrate 11 and silicon carbide epitaxial layer 22 may be formed of, for example, a 4H polytype of silicon carbide. Each of silicon carbide substrate 11 and silicon carbide epitaxial layer 22 includes carriers. Each of silicon carbide substrate 11 and silicon carbide epitaxial layer 22 includes, for example, nitrogen (N) as an n-type impurity. The conductivity type of each of silicon carbide substrate 11 and silicon carbide epitaxial layer 22 is, for example, an n-type (first conductivity type).

The n-type impurity included in silicon carbide epitaxial layer 22 has a concentration of $1\times10^{15}$ $cm^{-3}$ to $1\times10^{19}$ $cm^{3}$, for example. The lower limit of the concentration of the n-type impurity is not particularly limited and may be, for example, $5\times10^{15}$ $cm^{-3}$ or more, or $1\times10^{16}$ $cm^{3}$ or more. The upper limit of the concentration of the n-type impurity is not particularly limited and may be, for example, $5\times10^{18}$ $cm^{-3}$ or less, or $1\times10^{18}$ $cm^{3}$ or less. The concentration of the n-type impurity included in silicon carbide epitaxial layer 22 may be measured using, for example, a mercury probe C (Capacitance)–V (Voltage) measurement apparatus.

Silicon carbide epitaxial layer 22 may have a thickness (first thickness T1) of 15 μm or more, for example. The lower limit of the thickness (first thickness T1) of silicon carbide epitaxial layer 22 is not particularly limited, and may be, for example, 20 μm or more, or 30 μm or more. The upper limit of the thickness (first thickness T1) of silicon carbide epitaxial layer 22 is not particularly limited, and may be, for example, 100 μm or less, or 50 μm or less.

Silicon carbide epitaxial layer 22 may have a thickness (first thickness T1) of less than 15 μm, for example. The upper limit of the thickness (first thickness T1) of silicon carbide epitaxial layer 22 is not particularly limited, and may be, for example, 13 μm or less, or 10 μm or less. The lower limit of the thickness (first thickness T1) of silicon carbide epitaxial layer 22 is not particularly limited, and may be, for example, 1 μm or more, or 5 μm or more. Silicon carbide substrate 11 has a thickness (fifth thickness T5) of 350 μm to 500 μm, for example.

Next, a method of measuring the thickness of silicon carbide epitaxial layer 22 will be described.

The thickness of silicon carbide epitaxial layer 22 can be measured using, for example, a Fourier transform infrared spectrometer (FTIR). The measurement apparatus is, for example, a Fourier transform infrared spectrophotometer (IRPrestige-21) manufactured by Shimadzu Corporation. The FTIR measures the thickness of the silicon carbide epitaxial layer by utilizing a difference in optical constants caused by a difference in carrier concentrations between the silicon carbide epitaxial layer and silicon carbide substrate 11. The range of measured wavenumber is, for example, from 3400 $cm^{-1}$ to 2400 $cm^{-1}$. The wavenumber interval is, for example, about 4 $cm^{-1}$.

Specifically, the thickness of silicon carbide epitaxial layer 22 is measured by irradiating infrared light and measuring an interference between reflected light from second main surface 2 of silicon carbide epitaxial layer 22 and reflected light from interface 3 between silicon carbide epitaxial layer 22 and silicon carbide substrate 11.

(Pit)

Figure 3:
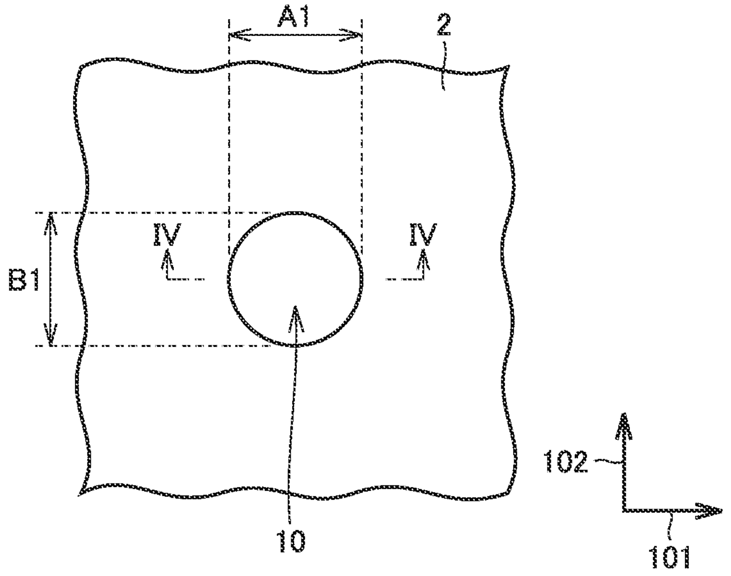
FIG. 3 is an enlarged plan view of a region III in FIG. 1.

FIG. 3 is an enlarged plan view of region III of FIG. 1. As shown in FIG. 3, there may be, for example, a pit 10 in second main surface 2 of silicon carbide epitaxial substrate 100. As shown in FIG. 3, when viewed in the direction perpendicular to second main surface 2, the shape of pit 10 is not particularly limited and may be, for example, a substantially circular shape. A value obtained by dividing a width (first width A1) of pit 10 along first direction 101 by a length (first length B1) of pit 10 along second direction 102 may be, for example, 0.1 to 10 or 0.2 to 5. When viewed in the direction perpendicular to second main surface 2, the shape of pit 10 may be, for example, rod-like.

When viewed in the direction perpendicular to second main surface 2, an area of pit 10 is 100 $\mu m^2$ or less. When viewed in the direction perpendicular to second main surface 2, the upper limit of the area of pit 10 is not particularly limited, and may be, for example, 80 $\mu m^2$ or less, or 60 $\mu m^2$ or less. When viewed in the direction perpendicular to second main surface 2, the lower limit of the area of pit 10 is not particularly limited, and may be, for example, 1 $\mu m^2$ or more, or 10 $\mu m^2$ or more.

The upper limit of the width (first width A1) of pit 10 along first direction 101 is not particularly limited, and may be, for example, 50 μm or less, 30 μm or less, or 10 μm or less. The lower limit of the width of pit 10 along first direction 101 (first width A1) is not particularly limited, and may be, for example, 1 μm or more, 2 μm or more, or 5 μm or more.

The upper limit of the length (first length B1) of pit 10 along second direction 102 is not particularly limited, and may be, for example, 50 μm or less, 30 μm or less, or 10 μm or less. The lower limit of the length (first length B1) of pit 10 along second direction 102 is not particularly limited, and may be, for example, 1 μm or more, 2 μm or more, or 5 μm or more.

Figure 4:
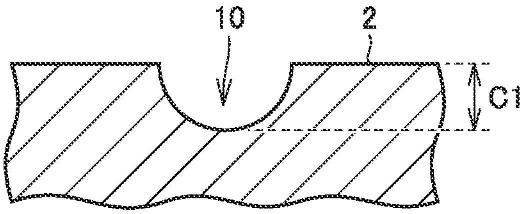
FIG. 4 is a schematic cross-sectional view taken along region IV-IV in FIG. 3.

FIG. 4 is a schematic cross-sectional view taken along the region IV-IV in FIG. 3. As shown in FIG. 4, pit 10 is a recess formed in second main surface 2. In a cross-sectional view, a side surface forming pit 10 may be curved. In the direction perpendicular to second main surface 2, a depth (first depth C1) of pit 10 is 0.01 μm to 0.1 μm. The upper limit of the depth (first depth C1) of pit 10 in the direction perpendicular to second main surface 2 is not particularly limited, and may be, for example, 0.09 μm or less, or 0.08 μm or less. The lower limit of the depth (first depth C1) of pit 10 in the direction perpendicular to second main surface 2 is not particularly limited, and may be, for example, 0.02 μm or more, or 0.03 μm or more.

An area density of pit 10 in second main surface 2 is $1/cm^2$ or less. The upper limit of the area density of pit 10 in second main surface 2 is not particularly limited, and may be, for example, $0.5/cm^2$ or less, or may be $0.3/cm^2$ or less, for example. The lower limit of the area density of pit 10 in second main surface 2 is not particularly limited, and may be, for example, $0.01/cm^2$ or more, or may be $0.1/cm^2$ or more, for example.

(Bump)

Figure 5:
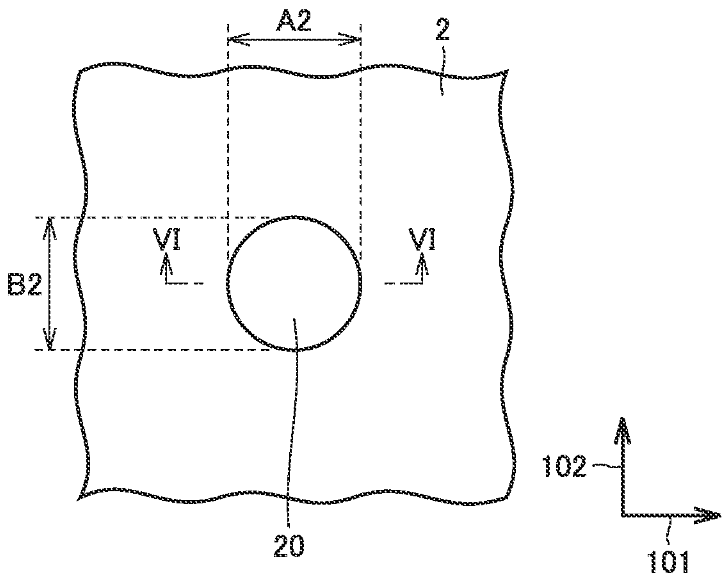
FIG. 5 is an enlarged plan view of a region V in FIG. 1.

FIG. 5 is an enlarged plan view of region V in FIG. 1. As shown in FIG. 5, there may be, for example, a bump 20 in second main surface 2 of silicon carbide epitaxial substrate 100. As shown in FIG. 5, when viewed in the direction perpendicular to second main surface 2, the shape of bump 20 is not particularly limited and may be, for example, a substantially circular shape. A value obtained by dividing a width (second width A2) of bump 20 along first direction 101 by a length (second length B2) of bump 20 along second direction 102 may be, for example, 0.1 to 10 or 0.2 to 5.

When viewed in a direction perpendicular to second main surface 2, an area of bump 20 is 100 $\mu m^2$ or less. When viewed in the direction perpendicular to second main surface 2, the upper limit of the area of bump 20 is not particularly limited, and may be, for example, 80 $\mu m^2$ or less, or 60 $\mu m^2$ or less. When viewed in the direction perpendicular to second main surface 2, the lower limit of the area of bump 20 is not particularly limited, and may be, for example, 1 $\mu m^2$ or more, or 10 $\mu m^2$ or more.

The upper limit of the width (second width A2) of bump 20 along first direction 101 is not particularly limited, and may be, for example, 50 μm or less, 30 μm or less, or 10 μm or less. The lower limit of the width (second width A2) of bump 20 along first direction 101 is not particularly limited, and may be, for example, 1 μm or more, 2 μm or more, or 5 μm or more.

The upper limit of the length of bump 20 along second direction 102 (second length B2) is not particularly limited, and may be, for example, 50 μm or less, 30 μm or less, or 10 μm or less. The lower limit of the length of bump 20 along second direction 102 (second length B2) is not particularly limited, and may be, for example, 1 μm or more, 2 μm or more, or 5 μm or more.

Figure 6:
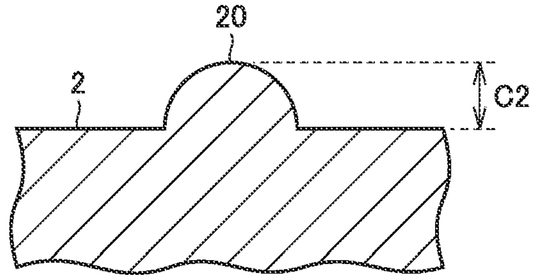
FIG. 6 is a schematic cross-sectional view taken along region VI-VI in FIG. 5.

FIG. 6 is a schematic cross-sectional view taken along region VI-VI in FIG. 5. As shown in FIG. 6, bump 20 is a protrusion formed in second main surface 2. In a cross-sectional view, side surfaces forming bumps 20 may be curved. In the direction perpendicular to second main surface 2, the height (second height C2) of bump 20 is 0.01 μm to 0.1 μm. The upper limit of the height (second height C2) of bump 20 in the direction perpendicular to second main surface 2 is not particularly limited, and may be, for example, 0.09 μm or less, or 0.08 μm or less. The lower limit of the height of bumps 20 (second height C2) in the direction perpendicular to second main surface 2 is not particularly limited, and may be, for example, 0.02 μm or more, or 0.03 μm or more.

An area density of bump 20 in second main surface 2 is 0.7/cm$^2$ or less. The upper limit of the area density of bump 20 in second main surface 2 is not particularly limited, and may be, for example, 0.5/cm$^2$ or less, may be, for example, 0.1/cm$^2$ or less, or may be, for example, 0.05/cm$^2$ or less. The lower limit of the area density of bump 20 in second main surface 2 is not particularly limited, and may be, for example, 0.01/cm$^2$ or more, or may be, for example, 0.02/cm$^2$ or more.

(Scratch)

Figure 7:
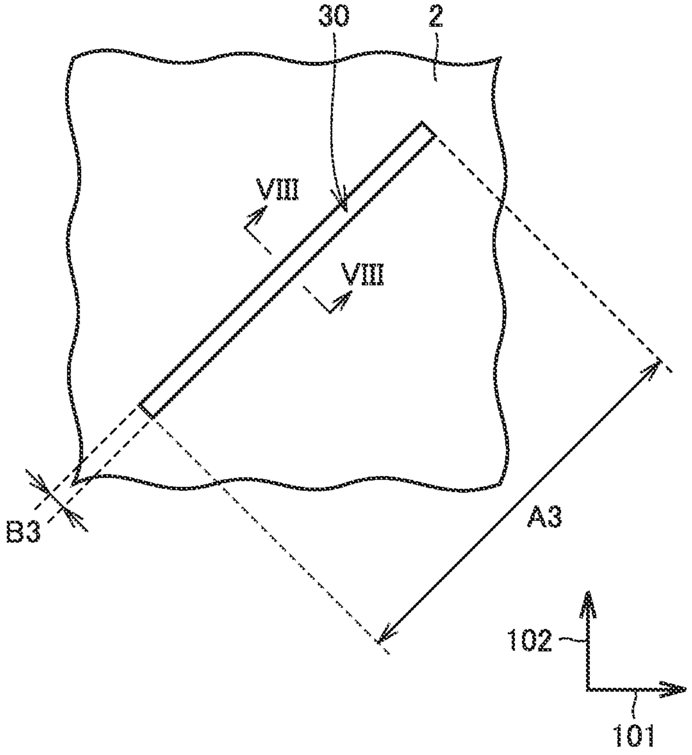
FIG. 7 is an enlarged plan view of region VII in FIG. 1.

FIG. 7 is an enlarged plan view of region VII in FIG. 1. As shown in FIG. 7, there may be, for example, a scratch 30 in second main surface 2 of silicon carbide epitaxial substrate 100. As shown in FIG. 7, when viewed in the direction perpendicular to second main surface 2, the shape of scratch 30 is not particularly limited, but may be, for example, a rod shape. When viewed in the direction perpendicular to second main surface 2, a value obtained by dividing a length (third width A3) of scratch 30 along a longitudinal direction of scratch 30 by a width (third length B3) of scratch 30 along a lateral direction of scratch 30 may be, for example, 7 or more, 10 or more, or 15 or more.

When viewed in the direction perpendicular to second main surface 2, the width (third length B3) of scratch 30 is 10 μm or less. The upper limit of the width (third length B3) of scratch 30 is not particularly limited, and may be, for example, 8 μm or less, 5 μm or less, or 3 μm or less. The lower limit of the width (third length B3) of scratch 30 is not particularly limited, and may be, for example, 0.1 μm or more, 0.2 μm or more, or 0.5 μm or more.

When viewed in the direction perpendicular to second main surface 2, a length (third width A3) of scratch 30 is 150 mm or less. The upper limit of the length (third width A3) of scratch 30 is not particularly limited and may be, for example, 90 mm or less, or 80 mm or less. The lower limit of the length (third width A3) of scratch 30 is not particularly limited, and may be, for example, 0.1 μm or more, 10 μm or more, 20 μm or more, or 50 μm or more.

Figure 8:
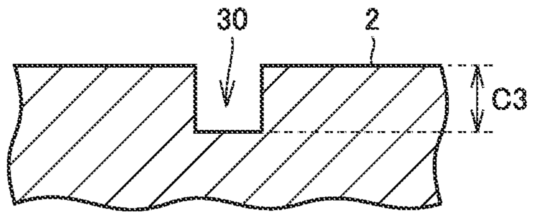
FIG. 8 is a schematic cross-sectional view taken along region VIII-VIII in FIG. 7.

FIG. 8 is a schematic cross-sectional view taken along region VIII-VIII in FIG. 7. The cross section shown in FIG. 8 is perpendicular to second main surface 2 and perpendicular to the longitudinal direction of scratch 30. As shown in FIG. 8, scratch 30 is a recess formed in second main surface 2. A depth (third depth C3) of scratch 30 is 0.2 μm or more in the direction perpendicular to second main surface 2. The upper limit of the depth (third depth C3) of scratch 30 in the direction perpendicular to second main surface 2 is not particularly limited, and may be, for example, 5 μm or less, or 2 μm or less. The lower limit of the depth (third depth C3) of scratch 30 in the direction perpendicular to second main surface 2 is not particularly limited, and may be, for example, 0.4 μm or more, or 0.6 μm or more.

An area density of scratch 30 in second main surface 2 is 1/cm$^2$ or less. The upper limit of the area density of scratch 30 in second main surface 2 is not particularly limited, and may be, for example, 0.5/cm$^2$ or less, 0.1/cm$^2$ or less, or 0.05/cm$^2$ or less. The lower limit of the area density of scratch 30 in second main surface 2 is not particularly limited, and may be, for example, 0.01/cm$^2$ or more, or may be, for example, 0.02/cm$^2$ or more.

(Confocal Differential Interference Contrast Microscope)

Pit 10, bump 20 and scratch 30 are identified by observing second main surface 2 of silicon carbide epitaxial substrate 100 using a defect inspection apparatus equipped with a confocal differential interference contrast microscope. As the defect inspection apparatus equipped with a confocal differential interference contrast microscope, for example, WASAVI series "SICA 6X" manufactured by Lasertec Corporation can be used. The magnification of an objective lens is, for example, 10 times. Second main surface 2 of silicon carbide epitaxial substrate 100 is irradiated with light having a wavelength of 546 nm from a light source such as a mercury-xenon lamp, and reflection light of the light is observed by a photodetector. Thereby, an SICA image of second main surface 2 is acquired.

The contrast of the SICA image is classified into 256 levels from 1 (minimum) to 256 (maximum). When the contrast is maximum, the SICA image is displayed darkest. When the contrast is minimum, the SICA image is displayed brightest. When a deep pit 10 is observed using SICA, the bottom of pit 10 is displayed dark. On the other hand, when a shallow pit 10 is observed using SICA, the bottom of pit 10 appears bright. Pits 10 having different contrasts are selected in advance, and the depth of each of pits 10 is measured with an atomic force microscope (AFM). This can estimate the depth of pit 10 based on the contrast (brightness) of the SICA image.

Pit 10, bump 20, and scratch 30 are defined based on the planar shape and the depth of each of pit 10, bump 20, and scratch 30. Based on the observed SICA image, pit 10, bump 20, and scratch 30 are identified. "Thresh S" which is an index of the measurement sensitivity of SICA is set to 40, for example.

Each of the total number of pits 10, the total number of bumps 20, and the total number of scratches 30 is counted over the entire surface of second main surface 2. The area density of pit 10 is a value obtained by dividing the total number of pits 10 in second main surface 2 by the area of second main surface 2. The area density of bump 20 is a value obtained by dividing the total number of bumps 20 in second main surface 2 by the area of second main surface 2. The area density of scratch 30 is a value obtained by dividing the total number of scratches 30 in second main surface 2 by the area of second main surface 2. An area within 5 mm from outer peripheral side surface 9 on second main surface 2 is excluded from the measured area for the area density of each of pit 10, bump 20, and scratch 30 (edge exclusion).

(Three-Dimensional Oblique Defect)

Figure 9:
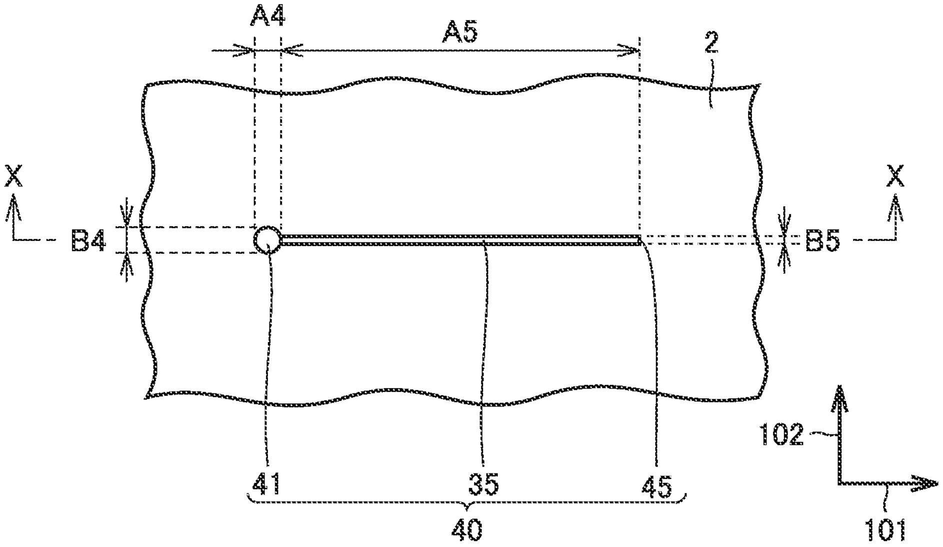
FIG. 9 is an enlarged plan view of region IX in FIG. 1.
Figure 10:
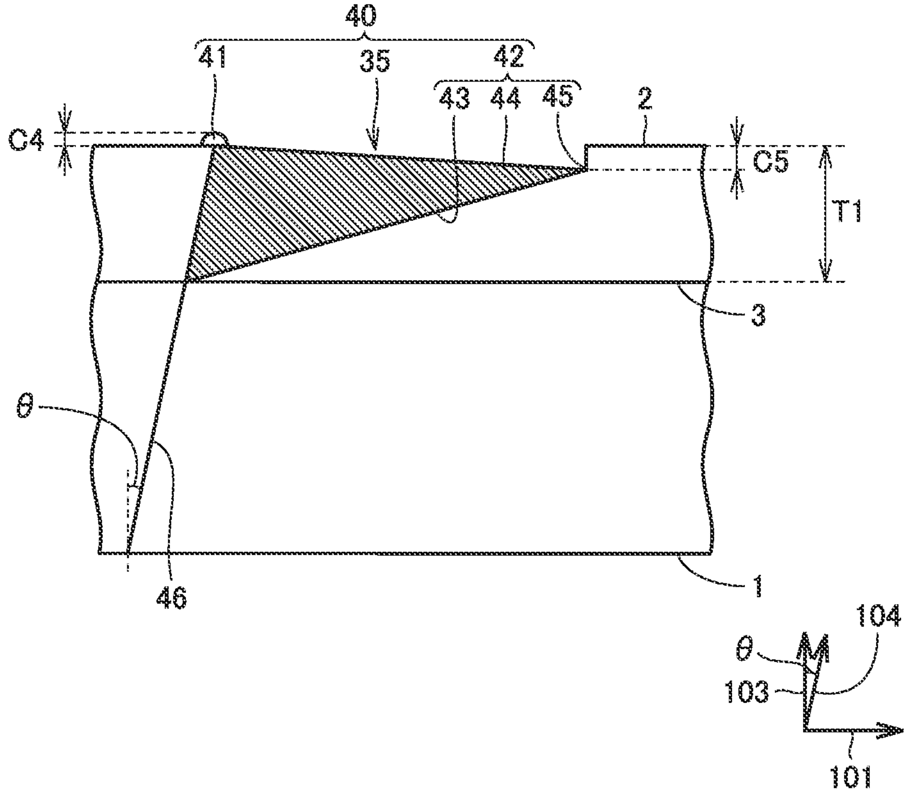
FIG. 10 is a schematic cross-sectional view taken along region X-X in FIG. 9.

FIG. 9 is an enlarged plan view of region IX in FIG. 1. FIG. 10 is a schematic cross-sectional view taken along region X-X in FIG. 9. As shown in FIGS. 9 and 10, there may be, for example, a three-dimensional oblique defect 40 in second main surface 2 of silicon carbide epitaxial substrate 100. As shown in FIG. 10, three-dimensional oblique defect 40 has a protruding portion 41 and a stacking fault 42. Stacking fault 42 is contiguous to protruding portion 41.

Stacking fault 42 may extend from protruding portion 41 along first direction 101. As shown in FIG. 10, a portion of a top surface 44 of stacking fault 42 forms a groove 35.

The shape of three-dimensional oblique defect 40 shown in FIG. 9 is a shape observed using the confocal differential interference contrast microscope. As shown in FIG. 9, when viewed in the direction perpendicular to second main surface 2, protruding portion 41 may have, for example, a substantially circular shape. When viewed in the direction perpendicular to second main surface 2, the shape of groove 35 may be, for example, rod-like.

As shown in FIG. 9, in first direction 101, a width (fifth width A5) of groove 35 is greater than a width (fourth width A4) of protruding portion 41. In first direction 101, the lower limit of the width (fifth width A5) of groove 35 is not particularly limited, but may be five times or more, or ten times or more the width (fourth width A4) of protruding portion 41. In first direction 101, the upper limit of the width (fifth width A5) of groove 35 is not particularly limited, but may be 100 times or less, or 50 times or less the width (fourth width A4) of protruding portion 41.

As shown in FIG. 9, in second direction 102, a length (fourth length B4) of protruding portion 41 may be greater than a length (fifth length B5) of groove 35. In second direction 102, the lower limit of the length (fourth length B4) of protruding portion 41 is not particularly limited, but may be 1.5 times or more, or 2 times or more the length (fifth length B5) of groove 35. In second direction 102, the upper limit of the length (fourth length B4) of protruding portion 41 is not particularly limited, but may be 20 times or less, or 10 times or less the length (fifth length B5) of groove 35.

The upper limit of the width of protruding portion 41 along first direction 101 (fourth width A4) is not particularly limited, and may be, for example, 50 μm or less, 30 μm or less, or 10 μm or less. The lower limit of the width (fourth width A4) of protruding portion 41 along first direction 101 is not particularly limited, and may be, for example, 1 μm or more, 2 μm or more, or 5 μm or more.

The upper limit of the length (fourth length B4) of protruding portion 41 along second direction 102 is not particularly limited, and may be, for example, 50 μm or less, 30 μm or less, or 10 μm or less. The lower limit of the length (fourth length B4) of protruding portion 41 along second direction 102 is not particularly limited, and may be, for example, 1 μm or more, 2 μm or more, or 5 μm or more.

A width (fifth width A5) of groove 35 along first direction 101 may be, for example, T1/tan θ. The width (fifth width A5) of groove 35 along first direction 101 may be, for example, not less than 0.9×(T1/tan θ) and not more than 1.1×(T1/tan θ), or may be not less than 0.8×(T1/tan θ) and not more than 1.2×(T1/tan θ).

The upper limit of the length of groove 35 along second direction 102 (fifth length B5) is not particularly limited, and may be, for example, 30 μm or less, 20 μm or less, or 5 μm or less. The lower limit of the length of groove 35 along second direction 102 (fifth length B5) is not particularly limited, and may be, for example, 0.1 μm or more, 0.5 μm or more, or 1 μm or more.

As shown in FIG. 10, stacking fault 42 is contiguous to a threading screw dislocation 46. Threading screw dislocation 46 extends continuously from first main surface 1 to interface 3. A direction in which threading screw dislocation 46 extends is a fourth direction 104. Fourth direction 104 is, for example, a <0001> direction. A third direction 103 is a direction perpendicular to second main surface 2. From another perspective, third direction 103 is a direction perpendicular to each of first direction 101 and second direction 102. An inclination angle θ of fourth direction 104 relative to third direction 103 corresponds to the off-angle of second main surface 2. Stacking fault 42 is in contact with threading screw dislocation 46 at interface 3.

As shown in FIG. 10, stacking fault 42 has top surface 44, a side portion 45, and a bottom surface 43. Bottom surface 43 is contiguous to threading screw dislocation 46 at interface 3. Top surface 44 is spaced apart from threading screw dislocation 46. Bottom surface 43 is in contact with protruding portion 41. Top surface 44 is in contact with protruding portion 41. Side portion 45 is spaced apart from protruding portion 41. Side portion 45 is a boundary between top surface 44 and bottom surface 43.

Bottom surface 43 may be located on the {0001} plane, for example. The {0001} plane is inclined relative to second main surface 2. Top surface 44 is contiguous to side portion 45. As shown in FIG. 10, top surface 44 may be inclined relative to bottom surface 43 when viewed in second direction 102. Top surface 44 may be inclined relative to second main surface 2. Bottom surface 43 is inclined relative to second main surface 2. The polytype of silicon carbide forming stacking fault 42 may be different from the polytype of silicon carbide forming silicon carbide substrate 11.

In the direction perpendicular to second main surface 2, a depth (fifth depth C5) of groove 35 formed by top surface 44 of stacking fault 42 is, for example, 0.1 μm or less. The upper limit of the depth (fifth depth C5) of groove 35 formed by top surface 44 of stacking fault 42 is not particularly limited, and may be, for example, 0.08 μm or less, or 0.06 μm or less. The lower limit of the depth (fifth depth C5) of groove 35 formed by top surface 44 of stacking fault 42 is not particularly limited, and may be, for example, 0.001 μm or more, or 0.01 μm or more. The depth of groove 35 may increase with increasing distance from protruding portion 41. Fifth depth C5 is a depth at the deepest position of groove 35.

In the direction perpendicular to second main surface 2, protruding portion 41 has a height (fourth height C4) of, for example, 0.05 μm or less. The upper limit of the height (fourth height C4) of protruding portion 41 in the direction perpendicular to second main surface 2 is not particularly limited, and may be, for example, 0.03 μm or less, or 0.01 μm or less. The lower limit of the height (fourth height C4) of protruding portion 41 in the direction perpendicular to second main surface 2 is not particularly limited, and may be, for example, 0.001 μm or more, or 0.003 μm or more.

In silicon carbide epitaxial substrate 100 according to the present embodiment, an area density of three-dimensional oblique defect 40 in second main surface 2 is, for example, $0.006/cm^2$ to $0.2/cm^2$. The lower limit of the area density of three-dimensional oblique defect 40 in second main surface 2 is not particularly limited, and may be, for example, $0.012/cm^2$ or more, or $0.024/cm^2$ or more. The upper limit of the area density of three-dimensional oblique defect 40 in second main surface 2 is not particularly limited, and may be, for example, $0.15/cm^2$ or less, or $0.1/cm^2$ or less.

Figure 11:
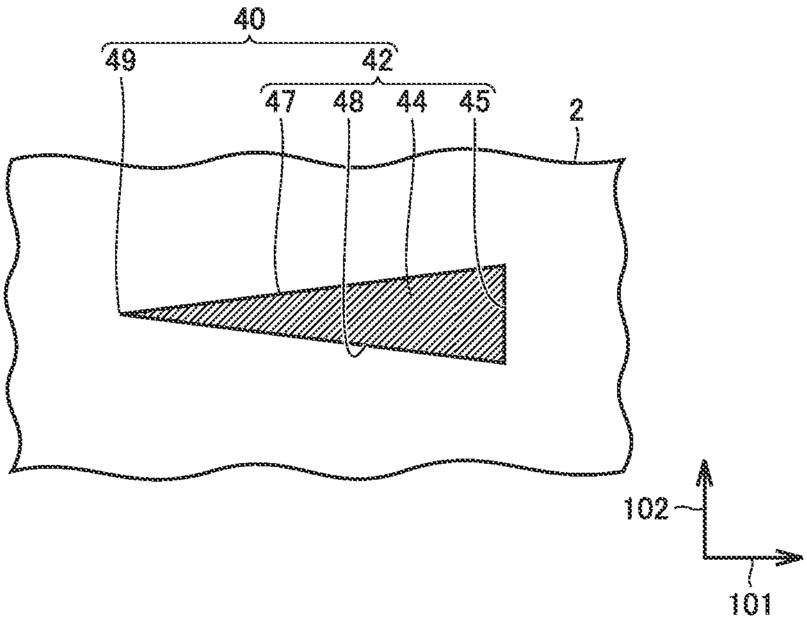
FIG. 11 is a schematic plan view showing a photoluminescence image of a three-dimensional oblique defect.

FIG. 11 is a schematic plan view showing a photoluminescence image of three-dimensional oblique defects 40. The schematic diagram of the image shown in FIG. 11 is a schematic diagram of an image captured by observing the same area as the observed area of the image shown in FIG. 9. As shown in FIG. 11, stacking fault 42 has a triangular shape when viewed in the direction perpendicular to second main surface 2. The region of stacking fault 42 and the region around stacking fault 42 have different contrasts (brightness). The region of stacking fault 42 is displayed darker than the region around stacking fault 42. Stacking fault 42 has a first side 47, a second side 48, and an apex 49. When viewed in the direction perpendicular to second main surface 2, apex 49 is located at protruding portion 41. Each of first side 47 and second side 48 is contiguous to apex 49.

As shown in FIG. 11, when viewed in the direction perpendicular to second main surface 2, each of first side 47 and second side 48 is contiguous to side portion 45. Side portion 45 may extend along second direction 102. Each of first side 47 and second side 48 may be inclined relative to first direction 101. The distance between first side 47 and second side 48 along second direction 102 may monotonically increase from apex 49 toward side portion 45.

(Photoluminescence Imaging Apparatus)

Three-dimensional oblique defect 40 can be identified by using both the defect inspection apparatus equipped with the confocal differential interference contrast microscope and the photoluminescence imaging apparatus. The defect inspection apparatus equipped with the confocal differential interference contrast microscope is, for example, the WASAVI series "SICA 6X" manufactured by Lasertec Corporation. The photoluminescence imaging apparatus is, for example, a photoluminescence imaging apparatus (model number: PLI-200-SMH5) manufactured by Photon Design Co., Ltd. When excitation light is irradiated to a measured area of second main surface 2 of silicon carbide epitaxial substrate 100, photoluminescence light is generated from the measured area. The photoluminescence light generated from the measured area is imaged by the photodetector. As described above, the photoluminescence image of the measured area is captured.

The energy of the excitation light is higher than the energy of the band gap of hexagonal silicon carbide. As the excitation light source, for example, a mercury xenon lamp is used. The wavelength of the exciting light is, for example, 313 nm. The intensity of the excitation light is, for example, 0.1 $mW/cm^2$ to 2 $W/cm^2$. The exposure time of the irradiation light is 0.5 seconds to 120 seconds, for example.

While silicon carbide epitaxial substrate 100 is moved along a direction parallel to second main surface 2, a photoluminescence image over the entire region of second main surface 2 is captured. The area of a measurement field of view is, for example, 2.6 mm×2.6 mm. Thus, the photoluminescence image over the entire region of second main surface 2 is mapped. Three-dimensional oblique defect 40 is observed in the captured photoluminescence image.

Three-dimensional oblique defects 40 can be identified by using a confocal differential interference contrast image (SICA image) measured by the defect inspection apparatus equipped with the confocal differential interference contrast microscope and the photoluminescence image measured by the photoluminescence imaging apparatus. In the SICA image, three-dimensional oblique defect 40 has protruding portion 41 and groove 35 contiguous to protruding portion 41. In the photoluminescence image, three-dimensional oblique defect 40 has a triangular shape. That is, three-dimensional oblique defect 40 is defined as a defect that has protruding portion 41 and groove 35 contiguous to protruding portion 41 in the SICA image and have a triangular shape in the photoluminescence image.

First, the confocal differential interference contrast image (SICA image) over the entire measurement region of second main surface 2 of silicon carbide epitaxial substrate 100 is measured using the WASAVI series "SICA 6X" manufactured by Lasertec Corporation. Based on the SICA image, the total number of three-dimensional oblique defects 40 defined by the confocal differential interference contrast image (SICA image) is counted on second main surface 2.

Next, the shape of the defect determined as three-dimensional oblique defect 40 in the SICA image is observed using the photoluminescence imaging apparatus. When the photoluminescence image of a defect observed by the photoluminescence imaging apparatus has a substantially triangular contrast image, the defect is determined to be three-dimensional oblique defect 40. On the other hand, when the photoluminescence image of a defect observed by the photoluminescence imaging apparatus does not have a substantially triangular contrast image, the defect is determined not to be three-dimensional oblique defect 40. In both the confocal differential interference image (SICA image) and the photoluminescence image, a defect determined to be three-dimensional oblique defect 40 is a true three-dimensional oblique defect 40. The area density of three-dimensional oblique defect 40 is a value obtained by dividing the total number of true three-dimensional oblique defects 40 in second main surface 2 by the area of second main surface 2. On second main surface 2, an area within 5 mm from outer peripheral side surface 9 is excluded from the measured area of the area density of three-dimensional oblique defect 40 (edge exclusion).

(Manufacturing Apparatus of Silicon Carbide Epitaxial Substrate)

Figure 12:
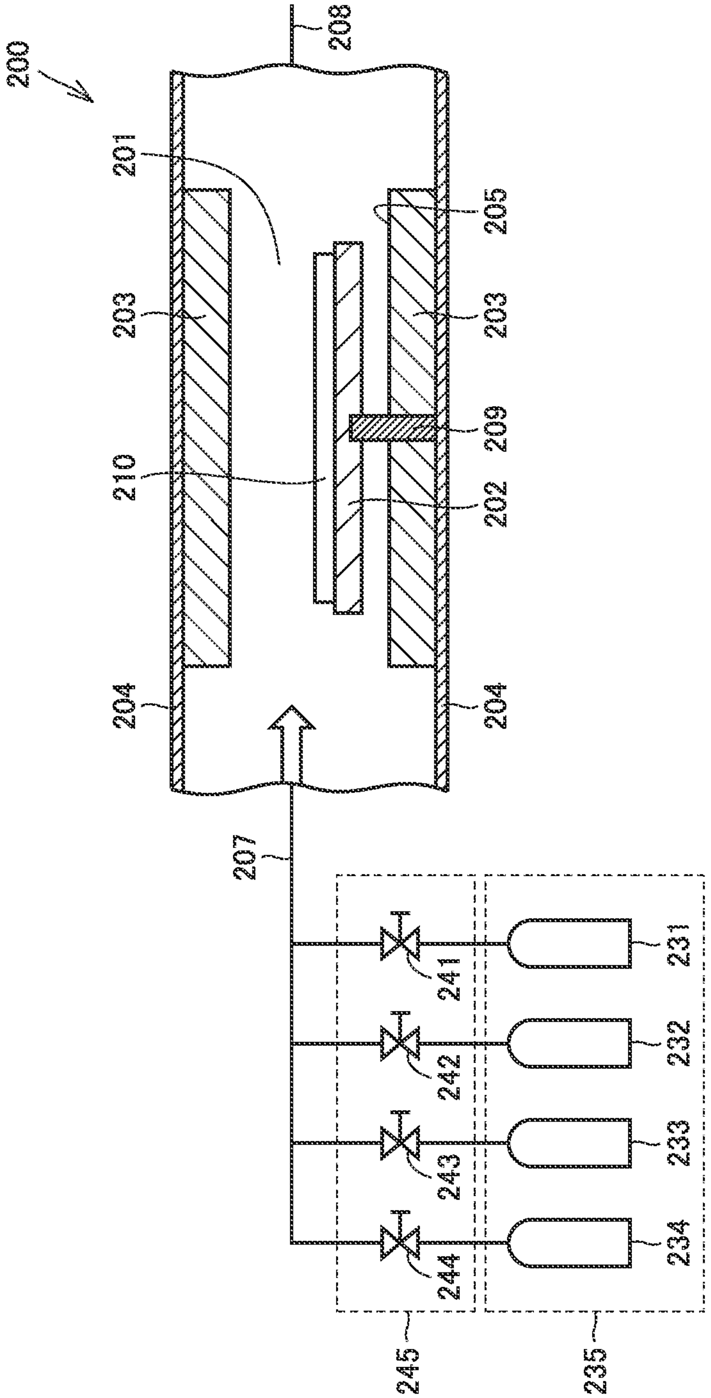
FIG. 12 is a partial cross-sectional schematic view showing the configuration of a manufacturing apparatus of a silicon carbide epitaxial substrate.

Next, the configuration of a manufacturing apparatus of silicon carbide epitaxial substrate 100 will be described. FIG. 12 is a partial cross-sectional schematic view showing the configuration of the manufacturing apparatus of silicon carbide epitaxial substrate 100. A manufacturing apparatus 200 of silicon carbide epitaxial substrate 100 is, for example, a hot wall type lateral chemical vapor deposition (CVD) apparatus. As shown in FIG. 12, manufacturing apparatus 200 of silicon carbide epitaxial substrate 100 mainly includes a reaction chamber 201, a gas supply unit 235, a controller 245, a heating element 203, a quartz tube 204, a heat insulator (not shown), and an induction heating coil (not shown).

Heating element 203 has a cylindrical shape, for example, and forms reaction chamber 201 therein. Heating element 203 is made of graphite, for example. Heating element 203 is provided in quartz tube 204. The heat insulator surrounds the outer circumference of heating element 203. The induction heating coil is wound along an outer circumference surface of quartz tube 204, for example. The induction heating coil is configured to be able to supply with an alternating current from an external power supply (not shown). Heating element 203 is thereby inductively heated. As a result, reaction chamber 201 is heated by heating element 203.

Reaction chamber 201 is a space formed by being surrounded by an inner wall surface 205 of heating element 203. A susceptor 210 for holding silicon carbide substrate 11 is provided in reaction chamber 201. Susceptor 210 is made of silicon carbide. Silicon carbide substrate 11 is placed on susceptor 210. Susceptor 210 is disposed on a stage 202. Stage 202 is supported by a rotation shaft 209 so as to be rotatable around its rotation axis. As stage 202 rotates, susceptor 210 rotates.

Manufacturing apparatus 200 of silicon carbide epitaxial substrate 100 further includes a gas inlet port 207 and a gas outlet port 208. Gas outlet port 208 is connected to an air exhaust pump (not shown). Arrows in FIG. 12 indicate a flow of gas. Gas is introduced into reaction chamber 201 through gas inlet port 207, and exhausted through gas outlet port 208. A pressure in reaction chamber 201 is adjusted by a balance between an amount of supplied gas and an amount of exhausted gas.

Gas supply unit 235 is configured to be able to supply mixed gas including source gas, dopant gas, and carrier gas to reaction chamber 201. Specifically, gas supply unit 235 includes, for example, a first gas supply unit 231, a second gas supply unit 232, a third gas supply unit 233, and a fourth gas supply unit 234.

First gas supply unit 231 is configured to be able to supply first gas including carbon atoms, for example. First gas supply unit 231 is, for example, a gas cylinder having the first gas therein. The first gas is, for example, propane ($C_3H_5$) gas. The first gas may be, for example, methane ($CH_4$) gas, ethane ($C_2H_6$) gas, acetylene ($C_2H_2$) gas, or the like.

Second gas supply unit 232 is configured to be able to supply second gas including, for example, silane gas. Second gas supply unit 232 is, for example, a gas cylinder having the second gas therein. The second gas is, for example, silane ($SiH_4$) gas. The second gas may be mixed gas of silane gas and gas other than silane.

Third gas supply unit 233 is configured to be able to supply third gas including, for example, nitrogen atoms. Third gas supply unit 233 is, for example, a gas cylinder having the third gas therein. The third gas is a dopant gas. The third gas is, for example, ammonia gas. Ammonia gas is thermally decomposed more easily than nitrogen gas having a triple bond.

Fourth gas supply unit 234 is configured to be able to supply fourth gas (carrier gas) such as hydrogen gas. Fourth gas supply unit 234 is, for example, a gas cylinder having hydrogen gas therein. The fourth gas may be argon gas.

Controller 245 is configured to be able to control a flow rate of the mixed gas supplied from gas supply unit 235 to reaction chamber 201. Specifically, controller 245 may include a first gas flow rate controller 241, a second gas flow rate controller 242, a third gas flow rate controller 243, and a fourth gas flow rate controller 244. Each of controllers may be, for example, a mass flow controller (MFC). Controller 245 is disposed between gas supply unit 235 and gas inlet port 207.

(Method of Manufacturing Silicon Carbide Epitaxial Substrate)

Figure 13:
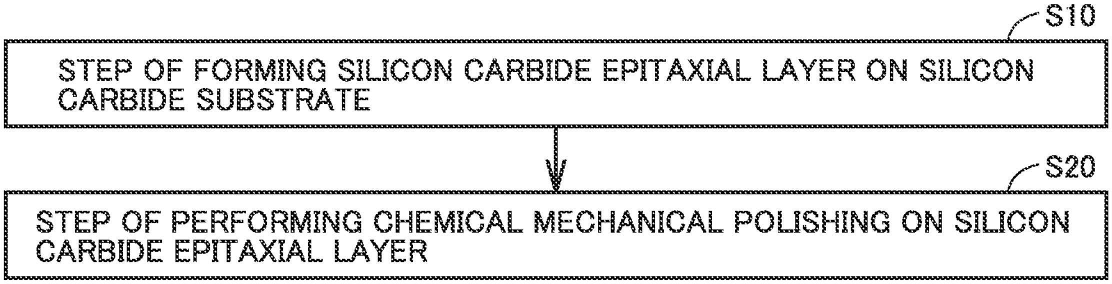
FIG. 13 is a flow chart schematically illustrating a method of manufacturing a silicon carbide epitaxial substrate according to the present embodiment.

Next, a method of manufacturing silicon carbide epitaxial substrate 100 according to the present embodiment will be described. FIG. 13 is a flow chart schematically illustrating a method of manufacturing silicon carbide epitaxial substrate 100 according to the present embodiment. As shown in FIG. 13, the method of manufacturing silicon carbide epitaxial substrate 100 according to the present embodiment mainly includes a step (S10) of forming a silicon carbide epitaxial layer on a silicon carbide substrate and a step (S20) of performing chemical mechanical polishing on the silicon carbide epitaxial layer.

First, silicon carbide substrate 11 is prepared by slicing an ingot made of a silicon carbide single crystal manufactured by, for example, a sublimation method with a wire saw. Silicon carbide substrate 11 is formed of silicon carbide having a polytype of 4H, for example. Silicon carbide substrate 11 has a diameter of 100 mm or more, for example. Silicon carbide substrate 11 has a thickness of 500 μm or less, for example. Silicon carbide substrate 11 includes an n-type impurity such as nitrogen. The n-type impurity has a concentration of $1\times10^{15}$ $cm^{-3}$ to $1\times10^{19}$ $cm^{-3}$, for example.

Next, the step (S10) of forming a silicon carbide epitaxial layer on the silicon carbide substrate is performed. First, silicon carbide substrate 11 is disposed on susceptor 210. Next, reaction chamber 201 is depressurized. Specifically, a pressure in reaction chamber 201 is reduced from the atmospheric pressure to about $1\times10^{-6}$ Pa, for example. Next, heating of silicon carbide substrate 11 is started. Hydrogen ($H_2$) gas, which is carrier gas, is introduced into reaction chamber 201 from fourth gas supply unit 234 during the heating.

Next, the source gas, the dopant gas, and the carrier gas are supplied to reaction chamber 201. Specifically, for example, mixed gas including silane, propane, ammonia, and hydrogen is introduced into reaction chamber 201. In reaction chamber 201, each gas is thermally decomposed. A growth temperature is, for example, from 1500° C. to 1750° C. The mixed gas may include argon instead of hydrogen.

A flow rate of the first gas (propane gas) is, for example, 29 sccm. A flow rate of the second gas (silane gas) is, for example, 46 sccm. A flow rate of the third gas (ammonia gas) is, for example, 1.5 sccm. A flow rate of the fourth gas is, for example, 100 slm. Reaction chamber 201 is maintained at a pressure of, for example, 2 kPa to 6 kPa. Through the above step, silicon carbide epitaxial layer 22 is formed on silicon carbide substrate 11.

Figure 14:
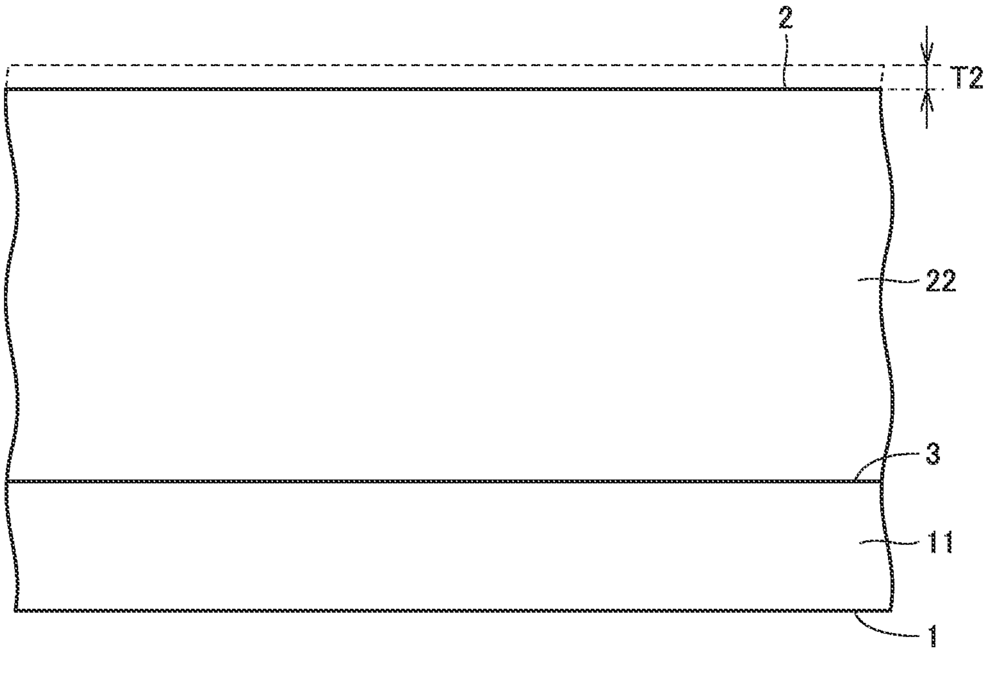
FIG. 14 is a schematic cross-sectional view showing a chemical mechanical polishing step performed on a silicon carbide epitaxial layer.

Next, a chemical mechanical polishing step (S20) is performed on the silicon carbide epitaxial layer. FIG. 14 is a schematic cross-sectional view showing a chemical mechanical polishing step performed on silicon carbide epitaxial layer 22. As shown in FIG. 14, a portion of silicon carbide epitaxial layer 22 is removed by performing chemical mechanical polishing on the silicon carbide epitaxial layer.

A removal amount T2 of silicon carbide epitaxial layer 22 is, for example, 0.1 μm to 0.4 μm. The upper limit of removal amount T2 of silicon carbide epitaxial layer 22 is not particularly limited, and may be, for example, 0.35 μm or less, or 0.3 μm or less. The lower limit of removal amount T2 of silicon carbide epitaxial layer 22 is not particularly limited, and may be, for example, 0.12 μm or more, or 0.15 μm or more.

Figure 15:
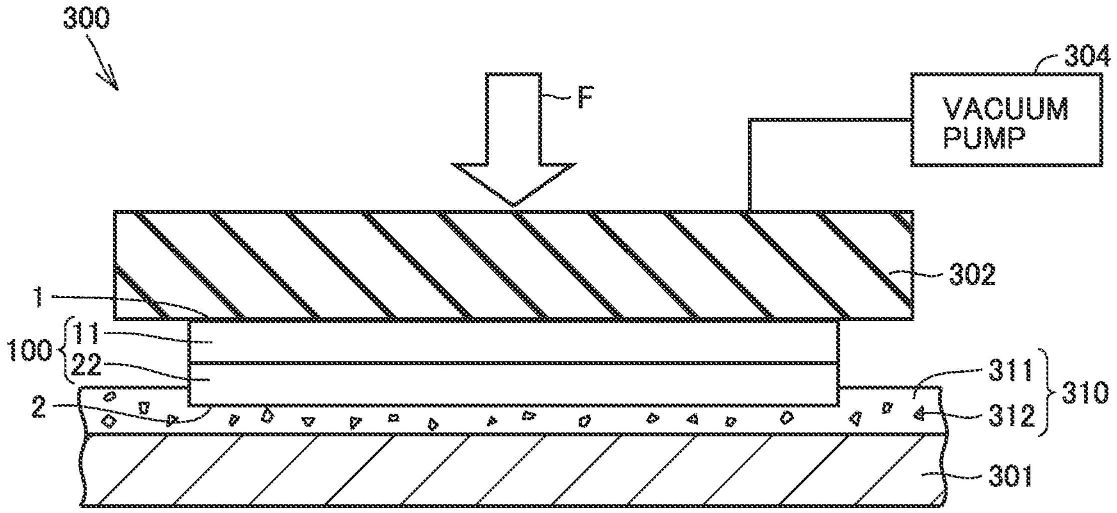
FIG. 15 is a schematic cross-sectional view showing the configuration of a chemical mechanical polishing machine.

FIG. 15 is a schematic cross-sectional view showing the configuration of a chemical mechanical polishing machine. As shown in FIG. 15, a chemical mechanical polishing machine 300 includes a polishing cloth 301, a polishing head 302, and a vacuum pump 304. Polishing cloth 301 is, for example, a suede. A polishing liquid 310 includes, for example, abrasive grains 312 and an oxidizing agent 311. Abrasive grains 312 are made of colloidal silica. For example, neither fumed silica nor alumina is usable for abrasive grains 312. Oxidizing agent 311 is, for example, a hydrogen peroxide solution.

As shown in FIG. 15, a silicon carbide a single-crystal substrate 110 is vacuum-chucked to polishing head 302 by using vacuum pump 304. Polishing head 302 is made of, for example, ceramics or stainless steel.

Performing chemical mechanical polishing on second main surface 2 of silicon carbide epitaxial substrate 100 allows the area densities of the pit, the bump, and the three-dimensional oblique defect to be effectively reduced without processing damage such as the scratch.

Second main surface 2 of silicon carbide epitaxial substrate 100 is disposed so as to face polishing cloth 301. Polishing liquid 310 including abrasive grains 312 is supplied between second main surface 2 and polishing cloth 301. A rotation speed of polishing head 302 is, for example, 60 rpm. A rotation speed of a surface plate provided with polishing cloth 301 is, for example, 60 rpm. A processing pressure F is, for example, 500 $g/cm^2$. After the chemical mechanical polishing step (S20) was performed on silicon carbide epitaxial layer 22, silicon carbide epitaxial substrate 100 may be cleaned using a cleaning solution such as pure water, acid, or alkali. Through the steps, silicon carbide epitaxial substrate 100 according to the embodiment of the present disclosure is manufactured.

(Method of Manufacturing Silicon Carbide Semiconductor Device)

Figure 16:
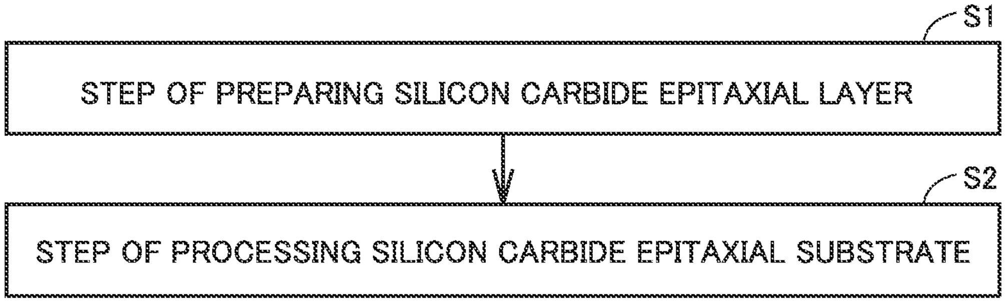
FIG. 16 is a flow chart schematically illustrating a method of manufacturing a silicon carbide semiconductor device according to the present embodiment.

Next, a method of manufacturing silicon carbide semiconductor device 400 according to the present embodiment will be described. FIG. 16 is a flow chart schematically illustrating a method of manufacturing silicon carbide semiconductor device 400 according to the present embodiment. As shown in FIG. 16, the method of manufacturing silicon carbide semiconductor device 400 according to the present embodiment mainly includes a step (S1) of preparing a silicon carbide epitaxial substrate and a step (S2) of processing the silicon carbide epitaxial substrate.

First, the step (S1) of preparing a silicon carbide epitaxial substrate is performed. In the step (S1) of preparing a silicon carbide epitaxial substrate, silicon carbide epitaxial substrate 100 according to the present embodiment is prepared (see FIG. 1).

Next, the step (S2) of processing the silicon carbide epitaxial substrate is performed. Specifically, the following processing is performed on silicon carbide epitaxial substrate 100. First, ion implantation is performed on silicon carbide epitaxial substrate 100. In silicon carbide epitaxial layer 22, for example, a body region is formed.

Figure 17:
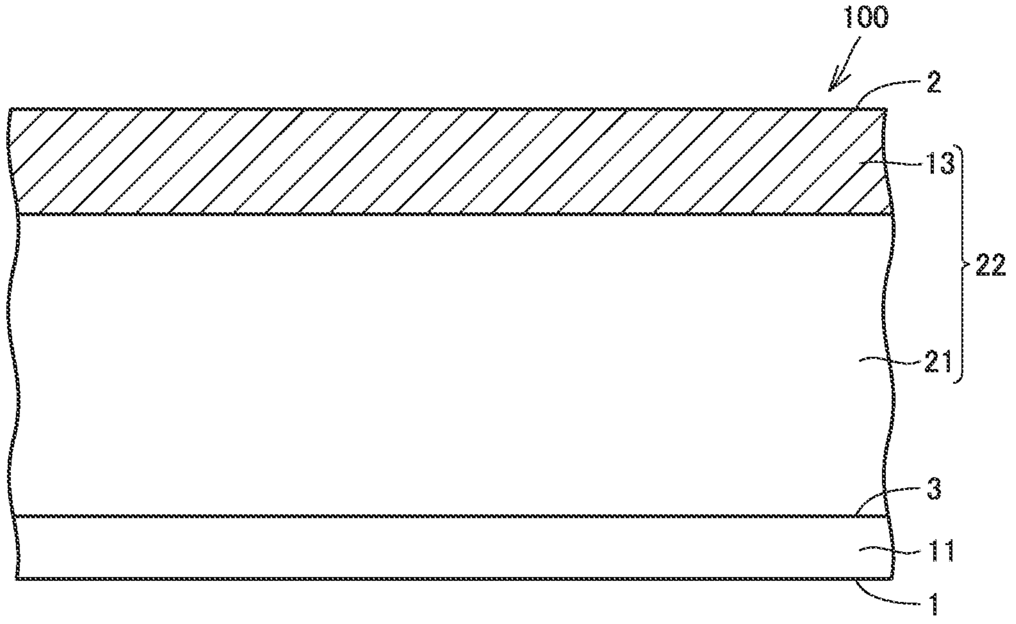
FIG. 17 is a schematic cross-sectional view showing a body region forming step.

FIG. 17 is a schematic cross-sectional view showing a body region forming step. Specifically, a p-type impurity such as aluminum is ion-implanted into second main surface 2 of silicon carbide epitaxial layer 22. Thus, a body region 13 having p-type conductivity is formed. In silicon carbide epitaxial layer 22, a portion where body region 13 is not formed serves as a drift region 21. Body region 13 has a thickness of 0.9 μm, for example.

Figure 18:
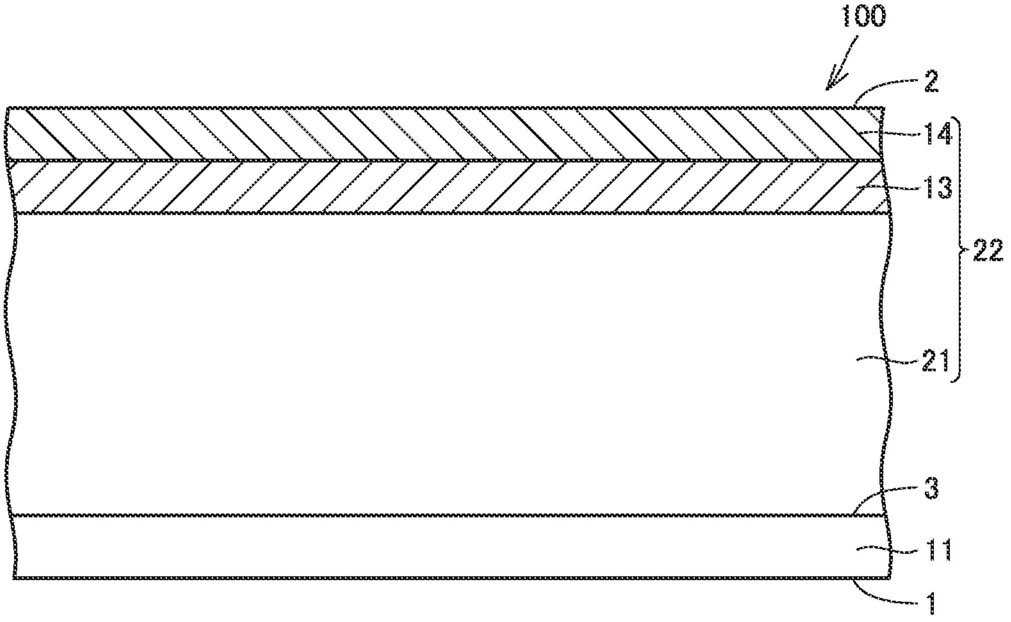
FIG. 18 is a schematic cross-sectional view showing a source region forming step.

Next, a source region forming step is performed. FIG. 18 is a schematic cross-sectional view showing the source region forming step. Specifically, an n-type impurity such as phosphorus is ion-implanted into body region 13. Thus, a source region 14 having n-type conductivity is formed. Source region 14 has a thickness of 0.4 μm, for example. A concentration of the n-type impurity included in source region 14 is higher than a concentration of the p-type impurity included in body region 13.

Next, a p-type impurity such as aluminum is ion-implanted into source region 14 to form a contact region 18. Contact region 18 is formed so as to penetrate source region 14 and body region 13 and come into contact with drift region 21. A concentration of the p-type impurity included in contact region 18 is higher than the concentration of the n-type impurity included in source region 14.

Next, activation annealing is performed to activate the ion-implanted impurities. A temperature of the activation annealing is preferably from 1500° C. to 1900° C., and is, for example, about 1700° C. The activation annealing is performed for a period of about 30 minutes, for example. The activation annealing is preferably performed in an inert gas atmosphere such as an argon atmosphere.

Figure 19:
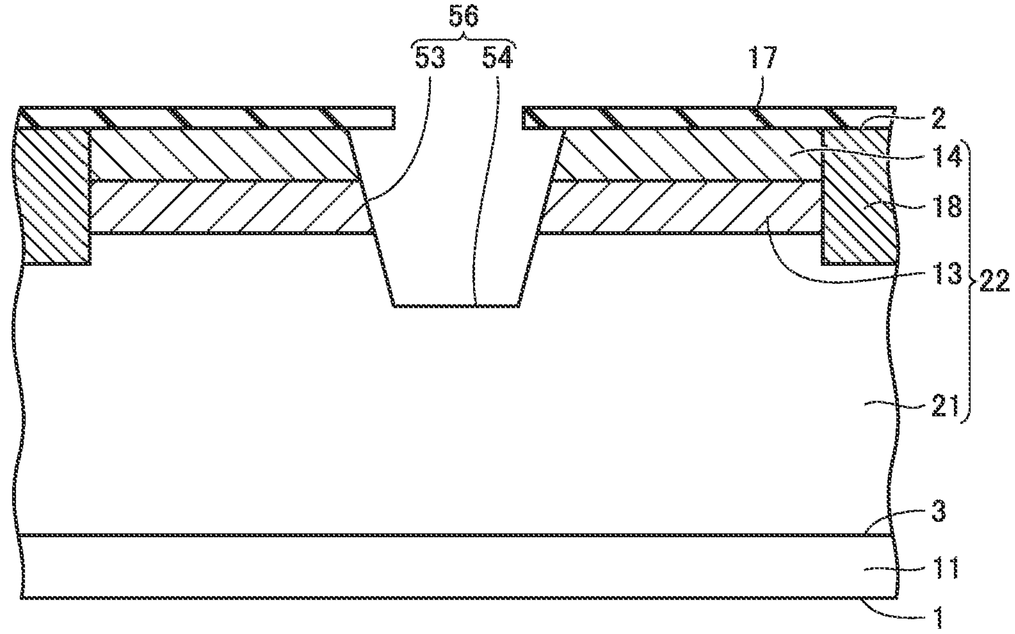
FIG. 19 is a schematic cross-sectional view showing a trench forming step performed on a second main surface of the silicon carbide epitaxial layer.

Next, a trench forming step is performed on second main surface 2 of silicon carbide epitaxial layer 22. FIG. 19 is a schematic cross-sectional view showing the trench forming step performed on second main surface 2 of silicon carbide epitaxial layer 22. A mask 17 having an opening is formed on second main surface 2 including source region 14 and contact region 18. Source region 14, body region 13, and a portion of drift region 21 are removed by etching using mask 17. As a method of etching, for example, reactive ion etching, particularly inductively coupled plasma reactive ion etching can be used. Specifically, for example, inductively coupled plasma reactive ion etching using $SF_6$ gas or mixed gas of $SF_6$ and $O_2$ as reactive gas can be used. A recess is formed on second main surface 2 by the etching.

Thermal etching is then performed on the recess. The thermal etching can be performed, for example, by heating in an atmosphere including a reactive gas having at least one kind of halogen atom in a state where mask 17 is formed on second main surface 2. The at least one kind of halogen atom includes at least one of a chlorine (Cl) atom or a fluorine (F) atom. The atmosphere includes, for example, $Cl_2$, $BCl_3$, $SF_6$, or $CF_4$. For example, mixed gas of chlorine gas and oxygen gas is used as the reactive gas, and thermal etching is performed at a heat treatment temperature of, for example, 700° C. to 1000° C. The reactive gas may include carrier gas in addition to the chlorine gas and the oxygen gas described above. As the carrier gas, for example, nitrogen gas, argon gas, helium gas or the like can be used.

As shown in FIG. 19, a trench 56 is formed in second main surface 2 by thermal etching. Trench 56 is defined by a side wall surface 53 and a bottom wall surface 54. Side wall surface 53 is formed of source region 14, body region 13, and drift region 21. Bottom wall surface 54 is formed of drift region 21. Next, mask 17 is removed from second main surface 2.

Figure 20:
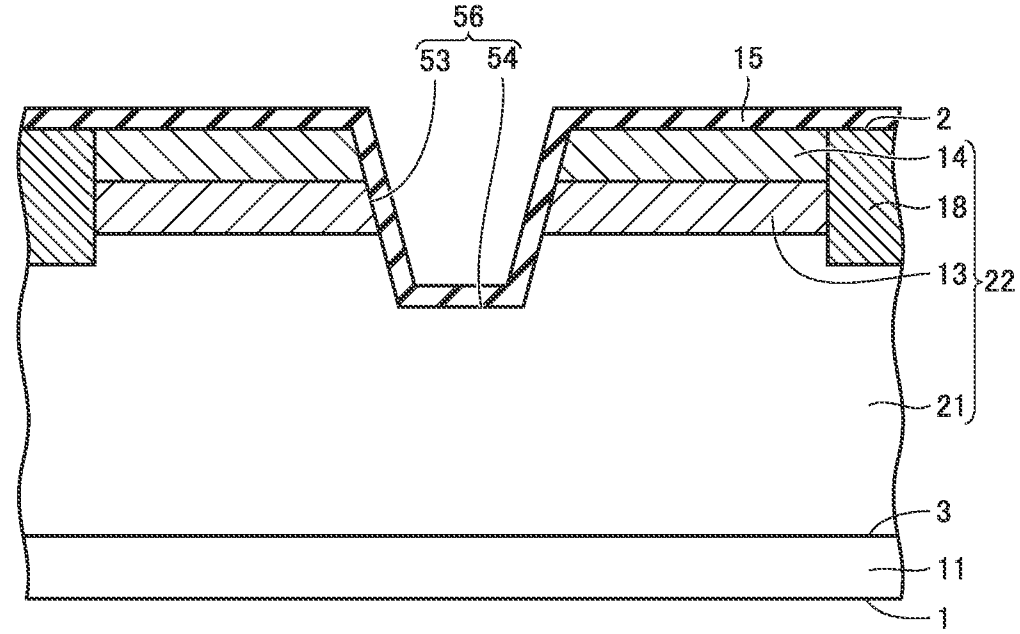
FIG. 20 is a schematic cross-sectional view showing a step of forming a gate insulating film.

Next, a step of forming a gate insulating film is performed. FIG. 20 is a schematic cross-sectional view showing a step of forming the gate insulating film. Specifically, silicon carbide epitaxial substrate 100 in which trench 56 is formed in second main surface 2 is heated at a temperature of 1300° C. to 1400° C., for example, in an atmosphere including oxygen. Thus, a gate insulating film 15 is formed in contact with drift region 21 on bottom wall surface 54, in contact with each of drift region 21, body region 13, and source region 14 on side wall surface 53, and in contact with each of source region 14 and contact region 18 on second main surface 2.

Figure 21:
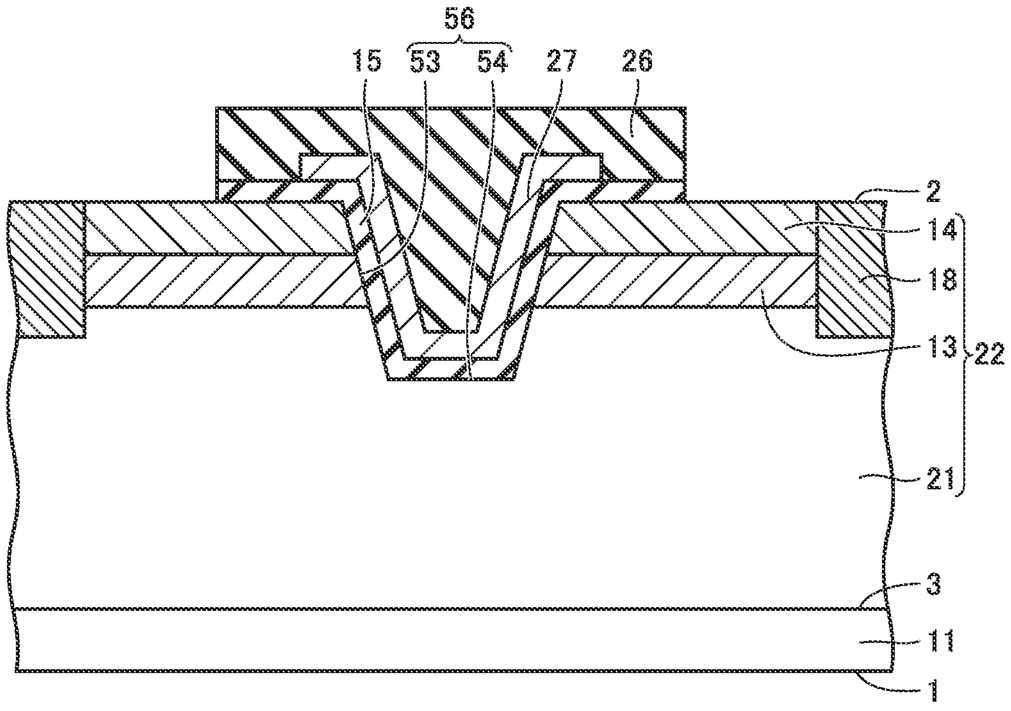
FIG. 21 is a schematic cross-sectional view showing a step of forming a gate electrode and an interlayer insulating film.

Next, a gate electrode forming step is performed. FIG. 21 is a schematic cross-sectional view showing a step of forming the gate electrode and an interlayer insulating film. A gate electrode 27 is formed so as to be in contact with gate insulating film 15 in trench 56. Gate electrode 27 is disposed in trench 56 and is formed on gate insulating film 15 so as to face each of side wall surface 53 and bottom wall surface 54 of trench 56. Gate electrode 27 is formed by, for example, a low pressure chemical vapor deposition (LPCVD) method.

Next, an interlayer insulating film is formed. Interlayer insulating film 26 is formed so as to cover gate electrode 27 and to be in contact with gate insulating film 15. Interlayer insulating film 26 is formed by, for example, a chemical vapor deposition method. Interlayer insulating film 26 is made of a material containing silicon dioxide, for example. Portions of interlayer insulating film 26 and gate insulating film 15 are then etched to form openings over source region 14 and contact region 18. Contact region 18 and source region 14 are thereby exposed from gate insulating film 15.

Next, a source electrode forming step is performed. A source electrode 16 is formed so as to be in contact with each of source region 14 and contact region 18. Source electrode 16 is formed by sputtering, for example. Source electrode 16 is made of a material containing Ti (titanium), Al (aluminum), and Si (silicon), for example.

Next, alloying annealing is performed. Specifically, source electrode 16 in contact with each of source region 14 and contact region 18 is held at a temperature of 900° C. to 1100° C. for about 5 minutes, for example. Thereby, at least a portion of source electrode 16 is silicided. As a result, source electrode 16 in ohmic contact with source region 14 is formed. Preferably, source electrode 16 is in ohmic contact with contact region 18.

Next, a source wire 19 is formed. Source wire 19 is electrically connected to source electrode 16. Source wire 19 is formed so as to cover source electrode 16 and interlayer insulating film 26.

Next, a drain electrode forming step is performed. First, first main surface 1 of silicon carbide substrate 11 is polished. Thus, the thickness of silicon carbide substrate 11 is reduced. Next, a drain electrode 23 is formed. Drain electrode 23 is formed so as to be in contact with first main surface 1. Through the steps above, silicon carbide semiconductor device 400 according to the embodiment of the present disclosure is manufactured.

Figure 22:
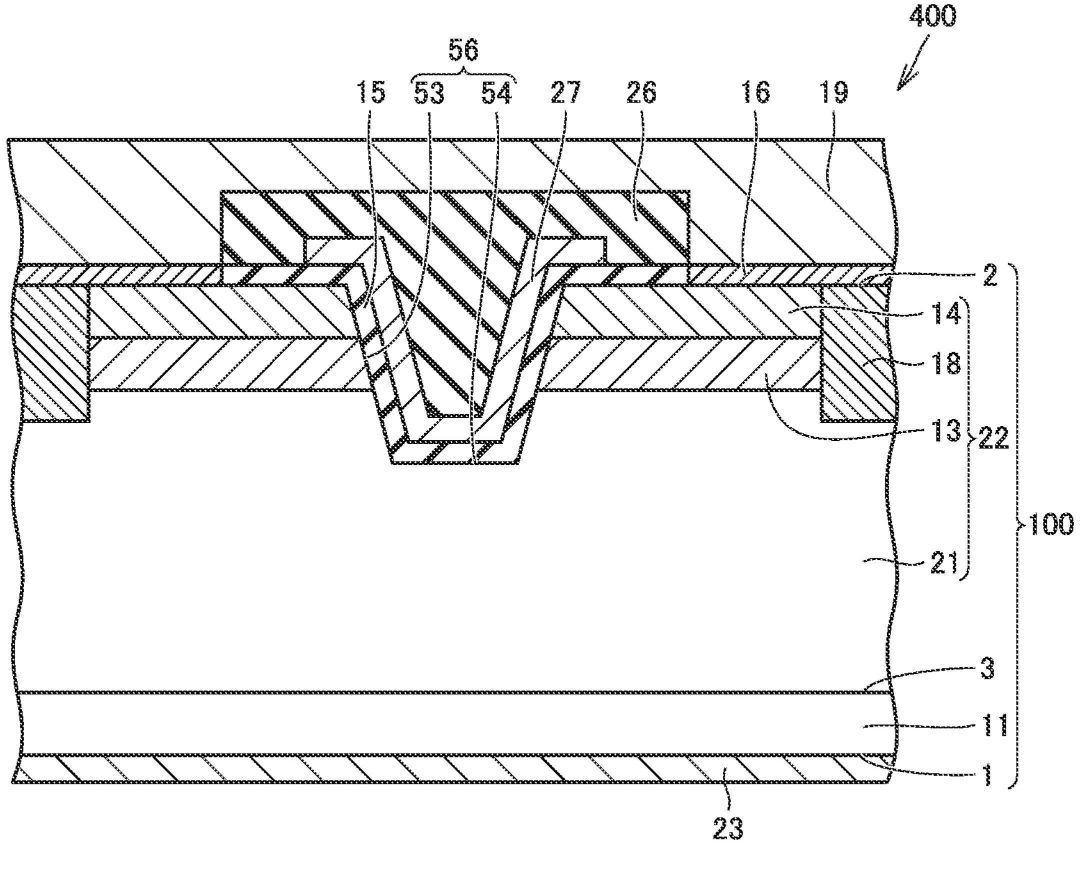
FIG. 22 is a schematic cross-sectional view showing the configuration of the silicon carbide semiconductor device according to the present embodiment.

FIG. 22 is a schematic cross-sectional view showing the configuration of the silicon carbide semiconductor device according to the present embodiment. Silicon carbide semiconductor device 400 is, for example, a metal oxide semiconductor field effect transistor (MOSFET). Silicon carbide semiconductor device 400 mainly includes silicon carbide epitaxial substrate 100, gate electrode 27, gate insulating film 15, source electrode 16, drain electrode 23, source wire 19, and interlayer insulating film 26. Silicon carbide epitaxial substrate 100 includes drift region 21, body region 13, source region 14, and contact region 18. Silicon carbide semiconductor device 400 may be, for example, an insulated gate bipolar transistor (IGBT) or the like.

Next, functions and effects of silicon carbide epitaxial substrate 100 and the method of manufacturing silicon carbide semiconductor device 400 according to the present embodiment will be described.

When silicon carbide semiconductor device 400 is manufactured, an oxide film may be formed on the main surface of silicon carbide epitaxial substrate 100. When the main surface of silicon carbide epitaxial substrate 100 has irregularities, the thickness of the oxide film formed on the main surface of silicon carbide epitaxial substrate 100 varies. In addition, if defects exist on the main surface of silicon carbide epitaxial substrate 100, the quality of the oxide film formed on the defects deteriorates. As a result, the reliability of silicon carbide semiconductor device 400 is reduced.

Polishing may be performed on the main surface of silicon carbide epitaxial substrate 100 in order to remove irregularities and defects existing on the main surface of silicon carbide epitaxial substrate 100. In the polishing step, main surface 2 of silicon carbide epitaxial substrate 100 is polished while silicon carbide epitaxial substrate 100 is pressed against polishing cloth 301.

When polishing step having a strong mechanical action is performed on main surface 2 of silicon carbide epitaxial substrate 100, scratch 30 is easily formed in main surface 2 of silicon carbide epitaxial substrate 100. In this case, variation in the thickness of the oxide film formed on main surface 2 of silicon carbide epitaxial substrate 100 becomes large. Therefore, the breakdown voltage of silicon carbide semiconductor device 400 varies. As a result, the reliability of silicon carbide semiconductor device 400 is reduced.

After intensive studies, the inventors have found that optimizing the polishing conditions of the chemical mechanical polishing step during the polishing allows the area density of each of pit 10 and bump 20 to be reduced while suppressing formation of scratch 30 in main surface 2 of silicon carbide epitaxial substrate 100. As a result, the reliability of silicon carbide semiconductor device 400 can be improved.

In silicon carbide epitaxial substrate 100 according to the present disclosure, an area density of pit 10 in main surface 2 is $1/cm^2$ or less. An area density of bump 20 in main surface 2 is less than $0.7/cm^2$. An area of pit 10 is 100 $\mu m^2$ or less and an area of bump 20 is 100 $\mu m^2$ or less when viewed in a direction perpendicular to main surface 2. In the direction perpendicular to main surface 2, a depth of pit 10 is 0.01 μm to 0.1 μm and a height of bump 20 is 0.01 μm to 0.1 μm. That is, the area densities of pit 10 and bump 20 are reduced in second main surface 2. Therefore, when an oxide film is formed on main surface 2 of silicon carbide epitaxial substrate 100, the quality of the oxide film can be prevented from being deteriorated. As a result, the reliability of silicon carbide semiconductor device 400 can be improved.

In silicon carbide epitaxial substrate 100 according to the present disclosure, silicon carbide epitaxial layer 22 may have a thickness of 15 μm or more. Compared with a case where the thickness of silicon carbide epitaxial layer 22 is small, pit 10 and bump 20 are more likely to occur when the thickness of silicon carbide epitaxial layer 22 is large. According to silicon carbide epitaxial substrate 100 of the present disclosure, when the thickness of silicon carbide epitaxial layer 22 is large, the occurrence of pit 10 and bump 20 can be significantly suppressed.

Furthermore, in silicon carbide epitaxial substrate 100 according to the present disclosure, an area density of three-dimensional oblique defect 40 in the main surface 2 may be $0.006/cm^2$ to $0.2/cm^2$. That is, the area density of three-dimensional oblique defect 40 is reduced in main surface 2. Therefore, when an oxide film is formed on main surface 2 of silicon carbide epitaxial substrate 100, the quality of the oxide film can be further prevented from being deteriorated. As a result, the reliability of silicon carbide semiconductor device 400 can be further improved.

Furthermore, in silicon carbide epitaxial substrate 100 according to the present disclosure, an area density of scratch 30 in the main surface 2 may be $1/cm^2$ or less. In other words, the area density of scratch 30 is reduced in main surface 2. Therefore, when an oxide film is formed on main surface 2 of silicon carbide epitaxial substrate 100, the quality of the oxide film can be further prevented from being deteriorated. As a result, the reliability of silicon carbide semiconductor device 400 can be further improved.

EXAMPLE (Sample Preparation)

First, silicon carbide epitaxial substrates 100 according to samples 1 to 3 and samples 6 to 10 were prepared. The thickness of each of silicon carbide epitaxial layers 22 of silicon carbide epitaxial substrates 100 according to samples 1 to 3 was 10 μm. The thickness of silicon carbide epitaxial layers 22 of silicon carbide epitaxial substrates 100 according to samples 6 to 10 was 30 μm.

The conditions of the chemical mechanical polishing step in the steps of manufacturing each of the silicon carbide epitaxial substrates according to samples 1 to 3 and samples 6 to 10 were as follows. The oxidizing agent was a hydrogen peroxide solution ($H_2O_2$). The polishing liquid including the oxidizing agent and abrasive grains was a DSC-0902 polishing liquid manufactured by Fujimi Inc. Polishing cloth 301 was a G804W polishing cloth manufactured by Fujibo Ehime Co., Ltd. Polishing cloth 301 has a high hardness and a low compressibility. Removal amount T2 of silicon carbide epitaxial layer 22 in the chemical mechanical polishing step was 0.1 μm. The rotation speed of polishing head 302 was 60 rpm. The rotation speed of the surface plate was 60 rpm. Processing pressure F was 500 g/cm$^2$.

(Method of Measurement)

First, before the chemical mechanical polishing step was performed on the silicon carbide epitaxial layer, the area density of each of the pit, the bump, and the three-dimensional oblique defect in the second main surface of the silicon carbide epitaxial layer was measured. Next, after the chemical mechanical polishing step was performed on main surface 2 of the silicon carbide epitaxial layer, the area density of each of the pit, the bump, and the three-dimensional oblique defect in the second main surface of the silicon carbide epitaxial layer was measured.

The area density of each of the pit and the bump was measured using WASAVI series "SICA 6X" manufactured by Lasertec Corporation. The method of measuring the area density of each of the pit and the bump was as described above. The area density of three-dimensional oblique defect was measured using the WASAVI series "SICA 6X" manufactured by Lasertec Corporation and the photoluminescence imaging device "PLI-200-SMH5" manufactured by Photon Design Co., Ltd. The method of measuring the area density of three-dimensional oblique defects was as described above.

(Results of Measurement)

TABLE 1

| Silicon Carbide Epitaxial Layer | | Sample Number | Bump (/cm$^2$) | Pit (/cm$^2$) | Three-Dimensional Oblique Defect (/cm$^2$) |
|---|---|---|---|---|---|
| Thickness 10 μm | Before CMP | Sample 1 | 0.77 | 4.40 | 0.33 |
| | | Sample 2 | 0.28 | 1.76 | 0.30 |
| | | Sample 3 | 0.20 | 1.02 | 0.34 |
| | After CMP | Sample 1 | 0.04 | 0.23 | 0.15 |
| | | Sample 2 | 0.02 | 0.17 | 0.04 |
| | | Sample 3 | 0.02 | 0.25 | 0.10 |
| Thickness 30 μm | Before CMP | Sample 6 | 3.52 | 226.70 | 0.26 |
| | | Sample 7 | 3.77 | 219.21 | 0.23 |
| | | Sample 8 | 2.88 | 248.74 | 0.21 |
| | | Sample 9 | 3.05 | 287.88 | 0.34 |
| | | Sample 10 | 6.99 | 420.12 | 0.85 |
| | After CMP | Sample 6 | 0.04 | 0.47 | 0.07 |
| | | Sample 7 | 0.02 | 0.23 | 0.07 |
| | | Sample 8 | 0.05 | 0.41 | 0.13 |
| | | Sample 9 | 0.08 | 0.98 | 0.14 |
| | | Sample 10 | 0.05 | 0.55 | 0.12 |

Table 1 shows the area densities of the pit, the bump, and the three-dimensional oblique defect of each of silicon carbide epitaxial substrates 100 according to samples 1 to 3 and samples 6 to 10. As shown in Table 1, in each of silicon carbide epitaxial substrates 100 according to samples 1 to 3 and samples 6 to 10, the area densities of the pit, the bump, and the three-dimensional oblique defect after the chemical mechanical polishing (CMP) were lower than the respective area densities of the pit, the bump, and the three-dimensional oblique defect before the chemical mechanical polishing (CMP).

As shown in Table 1, in each of silicon carbide epitaxial substrates 100 according to samples 1 to 3, the area density of the bump in second main surface 2 of silicon carbide epitaxial layer 22 after chemical mechanical polishing (CMP) was 0.02/cm$^2$ to 0.04/cm$^2$. The area density of the pit in second main surface 2 of silicon carbide epitaxial layer 22 was 0.17/cm$^2$ to 0.25/cm$^2$. The area density of the three-dimensional oblique defect in second main surface 2 of silicon carbide epitaxial layer 22 was 0.04/cm$^2$ to 0.15/cm$^2$.

As shown in Table 1, in each of silicon carbide epitaxial substrates 100 according to samples 6 to 10, the area density of the bump in second main surface 2 of silicon carbide epitaxial layer 22 after the chemical mechanical polishing (CMP) was 0.02/cm$^2$ to 0.08/cm$^2$. The area density of the pit in second main surface 2 of silicon carbide epitaxial layer 22 was 0.23/cm$^2$ to 0.98/cm$^2$. The area density of the three-dimensional oblique defect in second main surface 2 of silicon carbide epitaxial layer 22 was 0.07/cm$^2$ to 0.14/cm$^2$.

In each of silicon carbide epitaxial substrates 100 according to samples 1 to 3 and samples 6 to 10, no scratch was formed in second main surface 2 of silicon carbide epitaxial layer 22 after the chemical mechanical polishing (CMP). As described above, in each of silicon carbide epitaxial substrates 100 according to samples 1 to 10, it is possible to reduce the area density of each of the pit, the bump, and the three-dimensional oblique defect while suppressing the formation of the scratch in silicon carbide epitaxial layer 22.

As the thickness of silicon carbide epitaxial layer 22 increases, the area density of each of the pit, the bump, and the three-dimensional oblique defect in silicon carbide epitaxial layer 22 tends to increase. As shown in Table 1, each of silicon carbide epitaxial substrates 100 according to samples 6 to 10 in which silicon carbide epitaxial layer 22 had a thickness of 30 μm had higher area densities of the pit, the bump, and the three-dimensional oblique defect before the CMP than each of silicon carbide epitaxial substrates 100 according to samples 1 to 3 in which silicon carbide epitaxial layer 22 had a thickness of 10 μm. It was confirmed that the area density of each of the pit, the bump, and the three-dimensional oblique defect can be significantly reduced by chemical mechanical polishing each of silicon carbide epitaxial substrates 100 according to samples 6 to 10 in which silicon carbide epitaxial layer 22 has a thickness of is 30 μm.

It should be understood that the embodiment and example disclosed herein are illustrative and non-restrictive in every respect. The scope of the present invention is defined by the terms of the claims rather than the above description, and is intended to include any modifications within the scope and meaning equivalent to the terms of the claims.

REFERENCE SIGNS LIST

1 first main surface; 2 second main surface; 3 interface; 5 outer peripheral region, 6 central region; 7 orientation flat portion; 8 arc-shaped portion; 9 outer peripheral side surface: 10 pit; 11 silicon carbide substrate; 13 body region; 14 source region; 15 gate insulating film; 16 source electrode; 17 mask; 18 contact region; 19 source wire; 20 bump; 21 drift region; 22 silicon carbide epitaxial layer; 23 drain electrode; 26 interlayer insulating film; 27 gate electrode; 30 scratch; 35 groove; 40 three-dimensional oblique defect; 41 protruding portion; 42 stacking fault; 43 bottom surface; 44 top surface; 45 side portion; 46 threading screw dislocation; 47 first side; 48 second side; 49 apex; 50 square region; 53 side wall surface; 54 bottom wall surface; 56 trench; 100 silicon carbide epitaxial substrate; 101 first direction; 102 second direction; 103 third direction; 104 fourth direction; 110 single-crystal substrate; 200 manufacturing apparatus; 201 reaction chamber; 202 stage; 203 heating element; 204 quartz tube; 205 inner wall surface; 207 gas inlet port; 208 gas outlet port; 209 rotation shaft; 210 susceptor; 231 first gas supply unit; 232 second gas supply unit; 233 third gas supply unit; 234 fourth gas supply unit: 235 gas supply unit, 241 first gas flow rate controller, 242 second gas flow rate controller; 243 third gas flow rate controller; 244 fourth gas flow rate controller, 245 controller; 300 chemical mechanical polishing machine; 301 polishing cloth; 302 polishing head; 304 vacuum pump; 310 polishing liquid; 311 oxidizing agent; 312 abrasive grain; 400 silicon carbide semiconductor device; A1 first width; A2 second width; A3 third width; A4 fourth width; A5 fifth width; B1 first length; B2 second length; B3 third length; B4 fourth length; B5 fifth length; C1 first depth; C2 second height; C3 third depth; C4 fourth height; C5 fifth depth; F processing pressure; T1 first thickness; T2 removal amount; T5 fifth thickness; W1 diameter.

The invention claimed is:

1. A silicon carbide epitaxial substrate comprising:

a silicon carbide substrate; and a silicon carbide epitaxial layer on the silicon carbide substrate, wherein the silicon carbide epitaxial layer has a main surface located opposite to an interface between the silicon carbide substrate and the silicon carbide epitaxial layer, an area density of a pit in the main surface is $1/cm^2$ or less, an area density of a bump in the main surface is less than $0.1/cm^2$, an area of the pit is 100 $\mu m^2$ or less and an area of the bump is 100 $\mu m^2$ or less when viewed in a direction perpendicular to the main surface, and a depth of the pit is 0.01 μm to 0.1 μm and a height of the bump is 0.01 μm to 0.1 μm in the direction perpendicular to the main surface.

2. The silicon carbide epitaxial substrate according to claim 1, wherein the silicon carbide epitaxial layer has a thickness of 15 μm or more.

3. The silicon carbide epitaxial substrate according to claim 1, wherein the silicon carbide epitaxial layer has a thickness of less than 15 μm, and the area density of the pit in the main surface is $0.5/cm^2$ or less.

4. The silicon carbide epitaxial substrate according to claim 1, wherein an area density of a three-dimensional oblique defect in the main surface is $0.006/cm^2$ to $0.2/cm^2$.

5. The silicon carbide epitaxial substrate according to claim 1, wherein an area density of a scratch in the main surface is $1/cm^2$ or less, a width of the scratch is 10 μm or less and a length of the scratch is 150 mm or less when viewed in the direction perpendicular to the main surface, and a depth of the scratch is 0.2 μm or more in the direction perpendicular to the main surface.

6. A silicon carbide epitaxial substrate comprising:

a silicon carbide substrate; and a silicon carbide epitaxial layer on the silicon carbide substrate, wherein the silicon carbide epitaxial layer has a main surface located opposite to an interface between the silicon carbide substrate and the silicon carbide epitaxial layer, an area density of a bump in the main surface is less than $0.1/cm^2$, and an area density of a three-dimensional oblique defect in the main surface is $0.006/cm^2$ to $0.2/cm^2$.

7. A method of manufacturing a silicon carbide semiconductor device, the method comprising:

preparing the silicon carbide epitaxial substrate according to claim 1; and processing the silicon carbide epitaxial substrate.

* * * * *